US008013381B2

(12) United States Patent
Magome et al.

(10) Patent No.: US 8,013,381 B2
(45) Date of Patent: Sep. 6, 2011

(54) SEMICONDUCTOR DEVICE

(75) Inventors: Norio Magome, Kawasaki (JP);
Toshifumi Minami, Yokohama (JP);
Tomoaki Hatano, Yokohama (JP);
Norihisa Arai, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 256 days.

(21) Appl. No.: 12/360,941

(22) Filed: Jan. 28, 2009

(65) Prior Publication Data

US 2009/0194841 A1 Aug. 6, 2009

(30) Foreign Application Priority Data

Jan. 31, 2008 (JP) ................................. 2008-020632
Dec. 15, 2008 (JP) ................................. 2008-318453

(51) Int. Cl.
*H01L 29/788* (2006.01)
(52) U.S. Cl. ............... 257/316; 257/501; 257/E27.014; 257/398; 257/E21.558; 257/E21.043; 257/E21.551; 257/E21.557; 257/408; 257/77; 257/335; 257/487; 257/185; 257/360; 438/264; 438/217; 438/289; 438/291; 438/228; 438/276; 438/370; 438/546; 438/547; 438/549
(58) Field of Classification Search .................. 257/501, 257/E27.014, 398, 316, E21.558, E21.043, 257/E21.551, E21.557, 408, 77, 335, 288, 257/487, 185, 360; 438/264, 217, 289, 291, 438/228, 276, 370, 546, 547, 549
See application file for complete search history.

(56) References Cited

U.S. PATENT DOCUMENTS

| 4,859,619 | A | * | 8/1989 | Wu et al. ...................... 438/201 |
| 5,010,028 | A | * | 4/1991 | Gill et al. ..................... 438/263 |
| 5,144,389 | A | * | 9/1992 | Nakamura et al. ........... 257/339 |
| 5,306,652 | A | * | 4/1994 | Kwon et al. ................... 438/283 |
| 5,396,096 | A | * | 3/1995 | Akamatsu et al. ............ 257/336 |
| 5,494,851 | A | * | 2/1996 | Lee et al. ...................... 438/450 |
| 5,506,158 | A | * | 4/1996 | Eklund ......................... 438/202 |
| 5,510,643 | A | * | 4/1996 | Kariyama ..................... 257/409 |
| 5,852,570 | A | * | 12/1998 | Hotta et al. ................... 365/104 |
| 6,165,825 | A | * | 12/2000 | Odake .......................... 438/217 |
| 6,362,038 | B1 | * | 3/2002 | Lee et al. ...................... 438/225 |
| 6,461,921 | B1 | * | 10/2002 | Arai .............................. 438/298 |
| 6,590,271 | B2 | * | 7/2003 | Liu et al. ....................... 257/510 |

(Continued)

FOREIGN PATENT DOCUMENTS

JP 2004-297044 10/2004

(Continued)

*Primary Examiner* — N Drew Richards
*Assistant Examiner* — Ankush K Singal
(74) *Attorney, Agent, or Firm* — Oblon, Spivak, McClelland, Maier & Neustadt, L.L.P.

(57) ABSTRACT

A semiconductor device has a semiconductor substrate of a first conductivity type; first to third high-voltage insulated-gate field effect transistors formed on a principal surface of the semiconductor substrate; a first device isolation insulating film that is formed in the semiconductor substrate and isolates the first high-voltage insulated-gate field effect transistor and the second high-voltage insulated-gate field effect transistor from each other; a second device isolation insulating film that is formed in the semiconductor substrate and isolates the first high-voltage insulated-gate field effect transistor and the third high-voltage insulated-gate field effect transistor from each other; a first impurity diffusion layer of the first conductivity type that is formed below the first device isolation insulating film; and a second impurity diffusion layer of the first conductivity type that is formed below the second device isolation insulating film.

17 Claims, 15 Drawing Sheets

U.S. PATENT DOCUMENTS

| | | | |
|---|---|---|---|
| 6,960,501 B2* | 11/2005 | Komori et al. | 438/211 |
| 7,035,143 B2* | 4/2006 | Lee | 365/185.17 |
| 7,049,652 B2* | 5/2006 | Mokhlesi et al. | 257/315 |
| 7,064,392 B1* | 6/2006 | Morishita | 257/360 |
| 7,064,399 B2* | 6/2006 | Babcock et al. | 257/408 |
| 7,095,656 B2* | 8/2006 | Lee | 365/185.29 |
| 7,119,413 B2* | 10/2006 | Kutsukake et al. | 257/508 |
| 7,238,563 B2* | 7/2007 | Arai et al. | 438/217 |
| 7,272,042 B2* | 9/2007 | Nakai | 365/185.17 |
| 7,358,149 B2* | 4/2008 | Wang et al. | 438/433 |
| 7,462,539 B2* | 12/2008 | Tsunoda et al. | 438/267 |
| 7,511,346 B2* | 3/2009 | Yeh et al. | 257/370 |
| 7,521,318 B2* | 4/2009 | Ueno | 438/257 |
| 7,583,533 B2* | 9/2009 | Kutsukake et al. | 365/185.17 |
| 2003/0008451 A1* | 1/2003 | Hsu et al. | 438/201 |
| 2004/0232514 A1* | 11/2004 | Arai et al. | 257/510 |
| 2005/0093047 A1* | 5/2005 | Goda et al. | 257/300 |
| 2005/0180215 A1* | 8/2005 | Shum et al. | 365/185.22 |
| 2006/0160305 A1* | 7/2006 | Mokhlesi et al. | 438/257 |
| 2007/0040210 A1* | 2/2007 | Matsunaga | 257/315 |
| 2008/0191291 A1* | 8/2008 | Wu et al. | 257/409 |
| 2009/0184390 A1* | 7/2009 | Ueno | 257/506 |

FOREIGN PATENT DOCUMENTS

| | | |
|---|---|---|
| JP | 2005-294739 | 10/2005 |
| JP | 2006-59978 | 3/2006 |
| JP | 2007-234878 | 9/2007 |

\* cited by examiner

Y-Y' DIRECTION

Z-Z' DIRECTION

Y-Y' DIRECTION

Z-Z' DIRECTION

Y-Y' DIRECTION

Z-Z' DIRECTION

Y-Y' DIRECTION

Z-Z' DIRECTION

Y-Y' DIRECTION

Z-Z' DIRECTION

Y-Y' DIRECTION

Z-Z' DIRECTION

Y-Y' DIRECTION

Z-Z' DIRECTION

SEMICONDUCTOR DEVICE

CROSS-REFERENCE TO RELATED APPLICATION

This application is based upon and claims the benefit of priority from the prior Japanese Patent Application No. 2008-20632, filed on Jan. 31, 2008, and the Japanese Patent Application No. 2008-318453, filed on Dec. 15, 2008, the entire contents of which are incorporated herein by reference.

BACKGROUND OF THE INVENTION

1. Field of the Invention

The present invention relates to a semiconductor device applied to a high-voltage MOS transistor for controlling a nonvolatile semiconductor storage device, such as a NAND flash memory.

2. Background Art

Nonvolatile semiconductor storage devices include a NAND flash memory. The NAND flash memory has a row decoder circuit that selects from among word lines of memory cells. The row decoder circuit has a structure in which high-voltage MOSFETs (insulated-gate field effect transistors) associated with the word lines are arranged in an array.

In writing to a memory cell transistor, to decode the memory cell transistor to be written, a high program voltage (about 24 V, for example) is applied to the drain of the associated high-voltage MOS transistor.

At the same time, a pass voltage (about 13 V, for example) is applied to the drains of the high-voltage MOSFETs connected to the word lines of the memory cell transistors arranged in the bit line direction in the same block as the memory cell transistor to be written.

The program voltage and the pass voltage are supplied to the gates of the memory cell transistors through the respective word lines, thereby turning on the memory cell transistors.

The voltage applied to the drain of the diffusion layer of the high-voltage MOS transistor associated with the block including the memory cell not to be written is 0 V.

Therefore, in writing to a memory cell transistor, a high voltage is applied to the device isolation insulating film that isolates the high-voltage MOSFETs from each other.

Therefore, for example, if the device isolation insulating film is insufficiently formed, a field inversion can occur below the device isolation insulating film, and thus a current can flow between adjacent high-voltage MOSFETs.

Thus, to ensure the breakdown voltage between the high-voltage MOSFETs, for example, a conventional semiconductor device has a field inversion preventing layer immediately below the device isolation insulating film formed by implantation of about $1\times10^{17}/cm^3$ to $1\times10^{19}/cm^3$ of boron ions (B) (see Japanese Patent Laid-Open No. 2004-297044).

Another conventional semiconductor device has a shielding gate to which 0 V or a negative voltage is applied formed on the device isolation insulating film. In this case, formation of a channel below the device isolation insulating films is prevented, and thus field inversion is prevented (see Japanese Patent Laid-Open No. 2006-59978).

The conventional semiconductor devices described above can ensure the breakdown voltage of the device isolation insulating film between a high-voltage MOSFET to which the program voltage is applied and the adjacent high-voltage MOSFET in writing to a memory cell transistor. That is, the NAND flash memory can normally operate.

However, according to the configurations of the conventional semiconductor devices described above, a sufficient width of the device isolation insulating film needs to be wider (about 2 um, for example) in order to ensure the breakdown voltage against punch through when the potential difference between the diffusion layers (drains) of the adjacent high-voltage MOSFETs.

As a result, there is a problem that miniaturization of conventional nonvolatile semiconductor storage devices is difficult.

SUMMARY OF THE INVENTION

According to one aspect of the present invention, there is provided: a semiconductor device, comprising:

a semiconductor substrate of a first conductivity type;

a first high-voltage insulated-gate field effect transistor formed on a principal surface of the semiconductor substrate;

a second high-voltage insulated-gate field effect transistor formed on the principal surface of the semiconductor substrate;

a third high-voltage insulated-gate field effect transistor formed on the principal surface of the semiconductor substrate;

a first device isolation insulating film that is formed in the semiconductor substrate and isolates the first high-voltage insulated-gate field effect transistor and the second high-voltage insulated-gate field effect transistor from each other;

a second device isolation insulating film that is formed in the semiconductor substrate and isolates the first high-voltage insulated-gate field effect transistor and the third high-voltage insulated-gate field effect transistor from each other;

a first impurity diffusion layer of the first conductivity type that is formed below the first device isolation insulating film; and a second impurity diffusion layer of the first conductivity type that is formed below the second device isolation insulating film, wherein the gate electrode of the first high-voltage insulated-gate field effect transistor and the gate electrode of the second high-voltage insulated-gate field effect transistor are connected to each other over the first device isolation insulating film, and the impurity concentration of the second impurity diffusion layer is higher than the impurity concentration of the first impurity diffusion layer.

DETAILED DESCRIPTION

The present invention relates to a semiconductor device having a plurality of high-voltage MOSFETs for controlling a nonvolatile semiconductor storage device arranged in an array. The breakdown voltage for device isolation of the high-voltage MOSFETs is optimized, thereby increasing the integration density.

In the following, embodiments of the present invention will be described with reference to the drawings.

The embodiments of the present invention described below concern a case where the nonvolatile semiconductor storage device to which the semiconductor device according to the present invention is applied is a NAND flash memory.

However, the present invention can equally be applied to other nonvolatile semiconductor storage devices or other semiconductor devices having a similar configuration.

Embodiment 1

Figure 1:
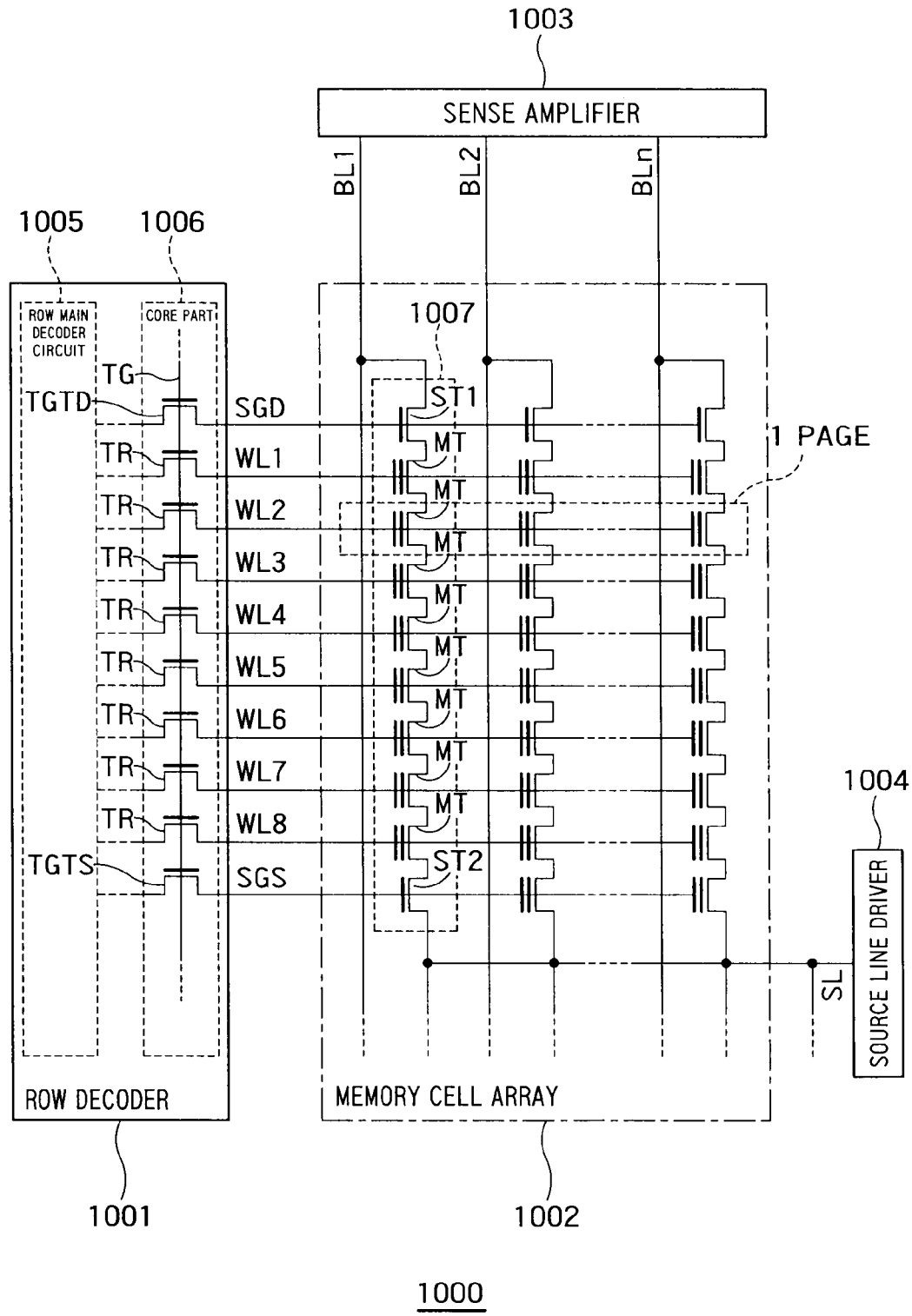
FIG. 1 is a schematic diagram showing an example of a memory cell array of a NAND flash memory 1000 having a semiconductor device 100 according to an embodiment 1 of the present invention, which is an aspect of the present invention, and a peripheral circuit thereof.

FIG. 1 is a schematic diagram showing an example of a memory cell array of a NAND flash memory 1000 having a semiconductor device 100 according to an embodiment 1 of the present invention, which is an aspect of the present invention, and a peripheral circuit thereof.

As shown in FIG. 1, the NAND flash memory 1000 has a row decoder 1001, a memory cell array 1002, a sense amplifier 1003 and a source line driver 1004.

The row decoder 1001 is configured to select one of word lines "WL1" to "WL8" and select gate lines "SGD" and "SGS". The row decoder 1001 has a row main decoder circuit part 1005 and a core part (row sub decoder circuit part) 1006.

The row main decoder circuit part 1005 decodes a row address signal and transmits the decoded row address signal to the core part 1006.

The core part 1006 has transfer gate transistors "TGTD" and "TGTS" connected to a common transfer gate line "TG" at their respective gates and a plurality of high-voltage MOSFETs (insulated-gate field effect transistors).

The memory cell array 1002 has a plurality of NAND cells (memory cells) 1007 arranged in a matrix.

Each NAND cell 1007 includes eight memory cell transistors "MT" and select transistors "ST1" and "ST2". The memory cell transistor "MT" has a multilayer structure in which a floating gate electrode is formed on a principal surface of a semiconductor substrate with a gate insulating film interposed therebetween, a inter-gate insulating film formed on the floating gate electrode, and a control gate electrode formed on the inter-gate insulating film (not shown).

The memory cell transistors "MT" are disposed between the select transistors "ST1" and "ST2" in such a manner that the current circuits thereof are connected in series to each other.

The number of memory cell transistors "MT" is not limited to 8 but can be 16, 32 or 64, for example.

Similarly, the number of select transistors "ST1" and "ST2" is not necessarily limited to 2. As far as selection from among the NAND cells 1007 is possible, either of the select transistors "ST1" and "ST2" may be omitted.

The control electrodes of the memory cell transistors "MT" in the same column are connected to the word lines "WL1" to "WL8", respectively. The gates of the select transistors "ST1", which are included in the same row, are connected to the select gate line "SGD", and the gates of the select transistors "ST2", which are included in the same row, are connected to the select gate line "SGS".

The drains of the select transistors "ST1", which are included in the same row, are connected to bit lines "BL1" to "BLn", respectively. The sources of the select transistors "ST2" are connected to a common source line "SL", which is connected to a source line driver 1004.

The sense amplifier 1003 is configured to amplify data read from the selected memory cell transistor "MT".

The source line driver 1004 is configured to apply a voltage to the source line "SL".

FIG. 1 shows only a representative one block in the memory cell array 1002 and the internal configuration of the core part 1006 associated with the block. Actually, however, the memory cell array 1002 includes a plurality of blocks. The core part 1006 also includes transfer gate transistors "TGTD" and "TGTS" and a plurality of high-voltage insulated-gate field effect transistors TR associated with the plurality of blocks.

Next, a configuration and function of the high-voltage insulated-gate field effect transistors used in the core part of the row decoder of the NAND flash memory 1000 will be described in detail.

In this embodiment, a case where the conductivity type of the semiconductor substrate is the p type will be described. However, an N-type semiconductor substrate may be used by inverting the polarity of the device.

Figure 2:
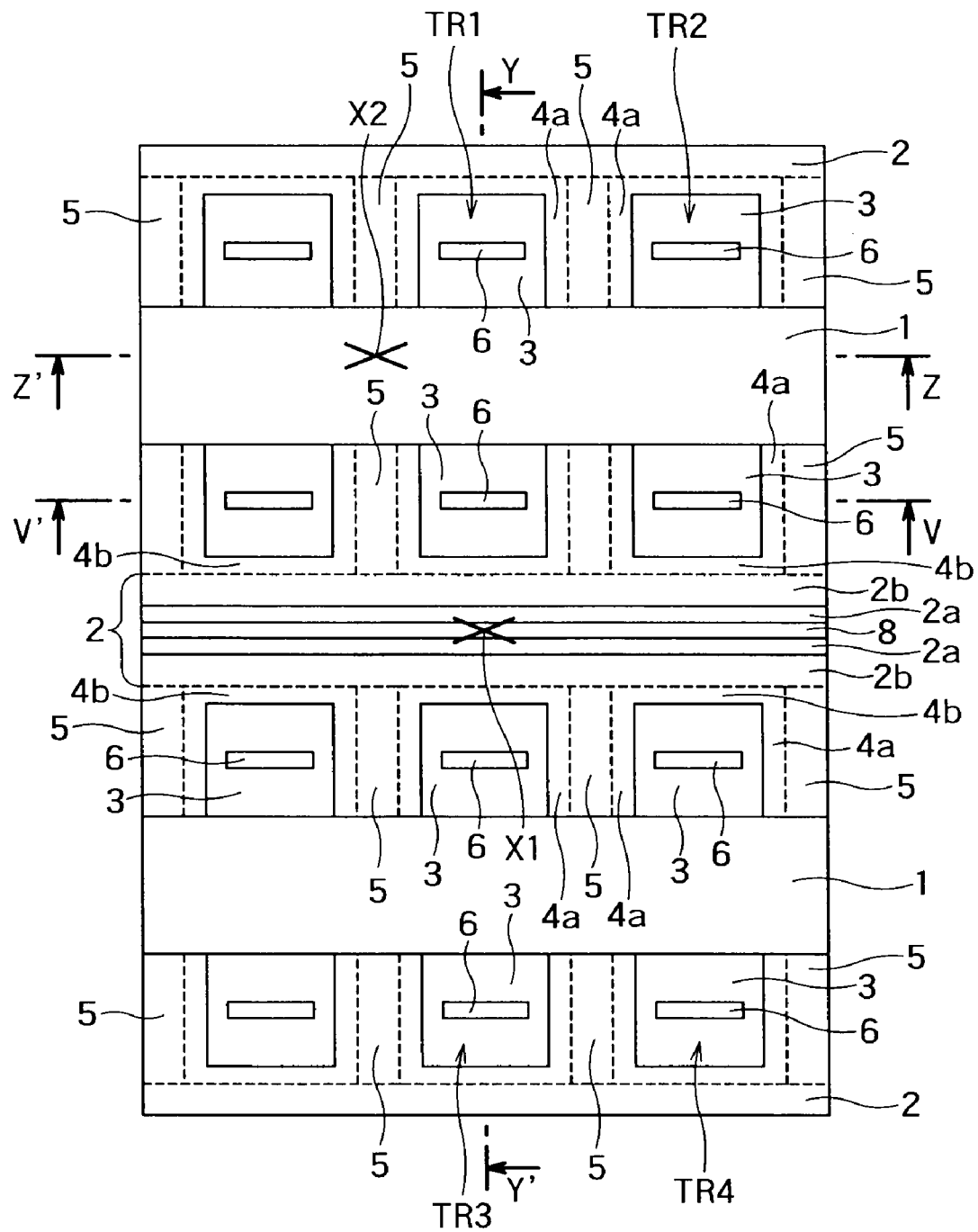
FIG. 2 is a schematic plan view showing an exemplary configuration of the semiconductor device 100 including high-voltage insulated-gate field effect transistors.

FIG. 2 is a schematic plan view showing an exemplary configuration of the semiconductor device 100 including high-voltage insulated-gate field effect transistors. For the sake of simplicity, illustration of some components including a contact electrode 9 and an interlayer insulating film 10 is omitted in FIG. 2.

Figure 3:
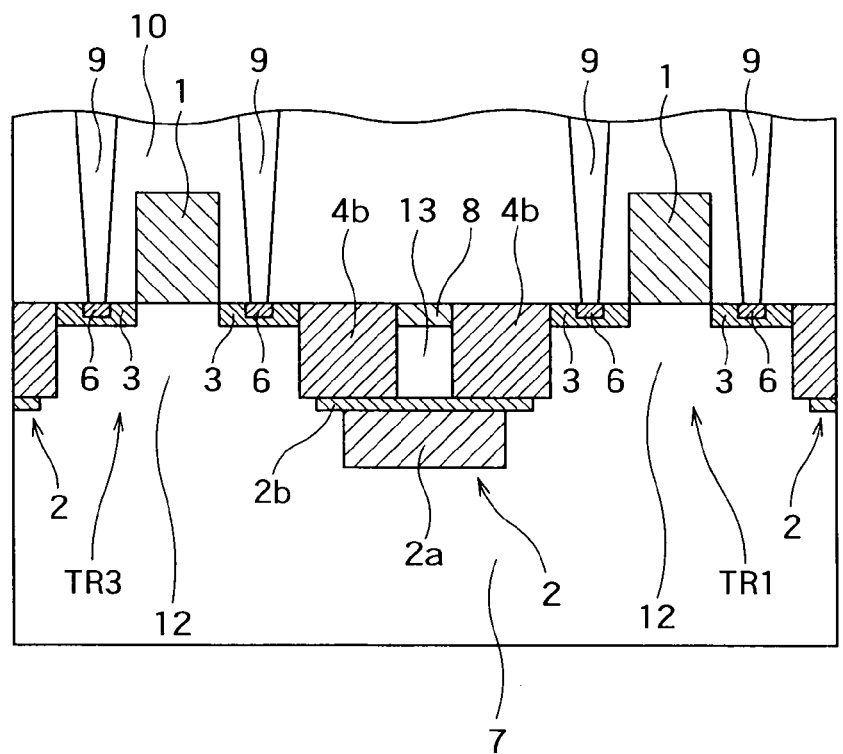
FIG. 3 is a cross-sectional view of the semiconductor device 100 taken along the line Y-Y' in FIG. 2.
Figure 4:
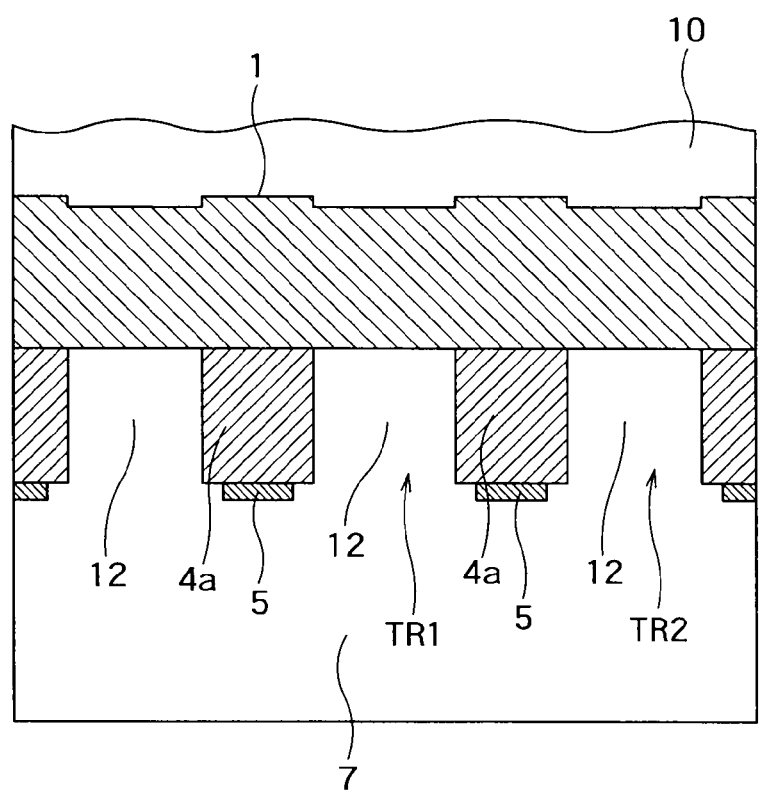
FIG. 4 is a cross-sectional view of the semiconductor device 100 taken along the line Z-Z' in FIG. 2.
Figure 5:
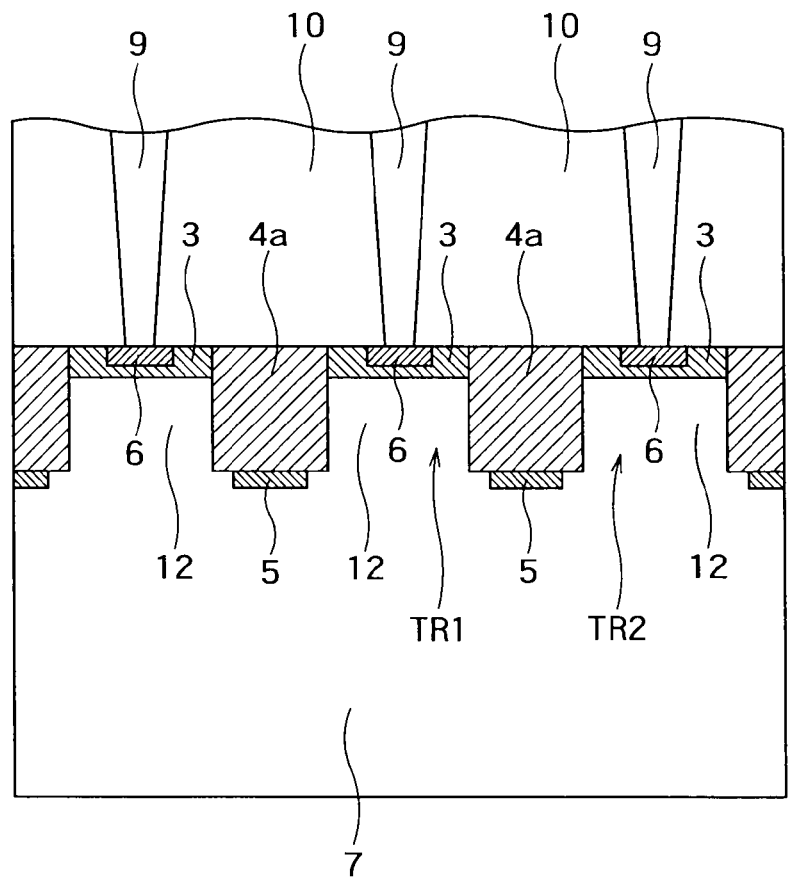
FIG. 5 is a cross-sectional view of the semiconductor device 100 taken along the line V-V' in FIG. 2.

FIG. 3 is a cross-sectional view of the semiconductor device 100 taken along the line Y-Y' in FIG. 2. FIG. 4 is a cross-sectional view of the semiconductor device 100 taken along the line Z-Z' in FIG. 2. FIG. 5 is a cross-sectional view of the semiconductor device 100 taken along the line V-V' in FIG. 2.

As shown in FIGS. 2 to 4, the semiconductor device 100 has a semiconductor substrate 7, a first high-voltage insulated-gate field effect transistor "TR1", a second high-voltage insulated-gate field effect transistor "TR2", a third high-voltage insulated-gate field effect transistor "TR3" and a fourth high-voltage insulated-gate field effect transistor "TR4".

Furthermore, the semiconductor device 100 has a first device isolation insulating film (STI: shallow trench isolation) 4a, a second device isolation insulating film 4b, a first impurity diffusion layer 5 of a first conductivity type (the p type in this example), and a second impurity diffusion layer 2 of the first conductivity type (the p type in this example).

The semiconductor substrate 7 is of the first conductivity type (the p type in this example) and has an impurity concentration of about $1\times10^{15}/cm^3$ to $1\times10^{17}/cm^3$, for example.

The first to fourth high-voltage insulated-gate field effect transistors "TR1" to "TR4" are formed on the principal surface of the semiconductor substrate 7.

The first and second high-voltage insulated-gate field effect transistors "TR1" and "TR2" are connected to memory cell transistors included in one block, which are simultaneously written, respectively.

The third and fourth high-voltage insulated-gate field effect transistors "TR3" and "TR4" are connected to memory cell transistors included another block (which is different from the block described above), which are simultaneously written, respectively.

The first device isolation insulating film 4a is formed in the semiconductor substrate 7 in the gate length direction (in the longitudinal direction in FIG. 2) between the first high-voltage insulated-gate field effect transistor "TR1" and the second high-voltage insulated-gate field effect transistor "TR2", and between the third high-voltage insulated-gate field effect transistor "TR3" and the fourth high-voltage insulated-gate field effect transistor "TR4".

The first device isolation insulating film 4a isolates the first high-voltage insulated-gate field effect transistor "TR1" and the second high-voltage insulated-gate field effect transistor "TR2" from each other. The first device isolation insulating film 4a also isolates the third high-voltage insulated-gate field effect transistor "TR3" and the fourth high-voltage insulated-gate field effect transistor "TR4" from each other.

The second device isolation insulating film 4b is formed in the semiconductor substrate 7 in the gate width direction (in the lateral direction in FIG. 2) between the first high-voltage insulated-gate field effect transistor "TR1" and the third high-voltage insulated-gate field effect transistor "TR3", and between the second high-voltage insulated-gate field effect transistor "TR2" and the fourth high-voltage insulated-gate field effect transistor "TR4".

The second device isolation insulating film 4b isolates the first high-voltage insulated-gate field effect transistor "TR1" and the third high-voltage insulated-gate field effect transistor "TR3" from each other. The second device isolation insulating film 4b also isolates the second high-voltage insulated-gate field effect transistor "TR2" and the fourth high-voltage insulated-gate field effect transistor "TR4" from each other.

The depth of the first and second device isolation insulating films 4a and 4b from the surface of the semiconductor substrate 7 is about 200 to 400 nm, for example.

In this example, the first device isolation insulating film 4a and the second device isolation insulating film 4b are perpendicular to each other on the principal surface of the semiconductor substrate 7.

The first and second device isolation insulating films 4a and 4b divide the semiconductor substrate 7 into a plurality of device regions 12, 13.

In the device region 12, an n⁻ diffusion layer (a source/drain region) 3 of a second conductivity type (the n type) containing about $1\times10^{17}/cm^3$ to $1\times10^{19}/cm^3$ of phosphor ion (P), for example, is formed. In the vicinity of the center of the n⁻ diffusion layer 3, an n⁺ diffusion layer 6 of the second conductivity type (the n type) containing about $1\times10^{20}/cm^3$ to $1\times10^{21}/cm^3$ of arsenic ion (As) is formed, for example.

In the device region 13, a p⁺ diffusion layer 8 of the first conductivity type (the p type) containing about $1\times10^{20}/cm^3$ to $1\times10^{21}/cm^3$ of boron ion (B), for example, is formed.

As shown in FIGS. 2 to 4, a gate electrode 1 of the first high-voltage insulated-gate field effect transistor "TR1" and a gate electrode 1 of the second high-voltage insulated-gate field effect transistor "TR2" are connected to each other over the first device isolation insulating film 4a. That is, these gate electrodes 1 are formed not only on the device region 12 but also on the device isolation insulating film 4a with a gate insulating film interposed therebetween (not shown).

Similarly, a gate electrode 1 of the third high-voltage insulated-gate field effect transistor "TR3" and a gate electrode 1 of the fourth high-voltage insulated-gate field effect transistor "TR4" are connected to each other over the first device isolation insulating film 4a. That is, these gate electrodes 1 are formed not only on the device region 12 but also on the device isolation insulating film 4a with a gate insulating film interposed therebetween (not shown).

However, the gate electrodes of the first to fourth high-voltage insulated-gate field effect transistors "TR1", "TR2" "TR3" and "TR4" are not formed on the second device isolation insulating film 4b. That is, the gate electrodes of the first and second high-voltage insulated-gate field effect transistors "TR1" and "TR2", which are adjacent to each other in the lateral direction in FIG. 2, are not connected to the gate electrodes of the third and fourth high-voltage insulated-gate field effect transistors "TR3" and "TR4", which are adjacent to the first and second high-voltage insulated-gate field effect transistors "TR1" and "TR2" in the longitudinal direction.

Furthermore, the drain of the first high-voltage insulated-gate field effect transistor "TR1" and the drain of the third high-voltage insulated-gate field effect transistor "TR3" are adjacent to each other with the second device isolation insulating film 4b interposed therebetween. Similarly, the drain of the second high-voltage insulated-gate field effect transistor "TR2" and the drain of the fourth high-voltage insulated-gate field effect transistor "TR4" are adjacent to each other with the second device isolation insulating film 4b interposed therebetween.

Furthermore, as shown in FIG. 3, the second impurity diffusion layer 2 is formed to continuously extend below the two device isolation insulating films 4b formed between the first and third high-voltage insulated-gate field effect transistors "TR1" and "TR3" and the p+ diffusion layer 8 formed between the two device isolation insulating films 4b. The second impurity diffusion layer 2 includes an impurity diffusion layer 2a and an impurity diffusion layer 2b.

The impurity diffusion layer 2a is formed below the second device isolation insulating films 4b. The impurity diffusion layer 2b is also formed below the second device isolation insulating films 4b. The impurity diffusion layers 2a and 2b function at least as a field inversion preventing layer.

The impurity diffusion layer 2a has a smaller width and a higher impurity concentration than the impurity diffusion layer 2b. Furthermore, the depth of the impurity diffusion layer 2a in the semiconductor substrate 7 at the peak of the impurity concentration thereof is greater than the depth of the impurity diffusion layer 2b in the semiconductor substrate 7 at the peak of the impurity concentration thereof.

For example, the impurity diffusion layer 2b has an impurity concentration (boron ion(B)) of about $1\times10^{16}/cm^3$ to $1\times10^{17}/cm^3$. On the other hand, the impurity diffusion layer 2a has an impurity concentration (boron ion(B)) of about $1\times10^{17}/cm^3$ to $1\times10^{18}/cm^3$.

There may be a region in which the impurity diffusion layers 2a and 2b overlap. The impurity diffusion layer 2b may be omitted as required. The impurity diffusion layer 2b may be formed only below the second device isolation insulating films 4b or, in other words, may not be formed below the p+ diffusion layer 8.

In addition, as shown in FIG. 4, the first impurity diffusion layer 5 is formed below the first device isolation insulating film 4a. The first impurity diffusion layer 5 functions as a field inversion preventing layer.

In this example, the impurity concentration and the impurity concentration peak of the first field inversion preventing layer 5 are the same as those of the impurity diffusion layer 2b, for example.

That is, the second impurity diffusion layer 2 has a smaller width and a higher impurity concentration than the first impurity diffusion layer 5. Furthermore, the depth of the second impurity diffusion layer 2 in the semiconductor substrate 7 at the peak of the impurity concentration thereof is greater than the depth of the first impurity diffusion layer 5 in the semiconductor substrate 7 at the peak of the impurity concentration thereof.

In addition, as shown in FIGS. 2 and 5, the interlayer insulating film 10 is formed on the semiconductor substrate 7. The contact electrode 9 penetrating the interlayer insulating film 10 is connected to the n+ diffusion layer 6 to supply a potential to the source or drain of the first to fourth high-voltage insulated-gate field effect transistors "TR1" to "TR4".

Figure 6:
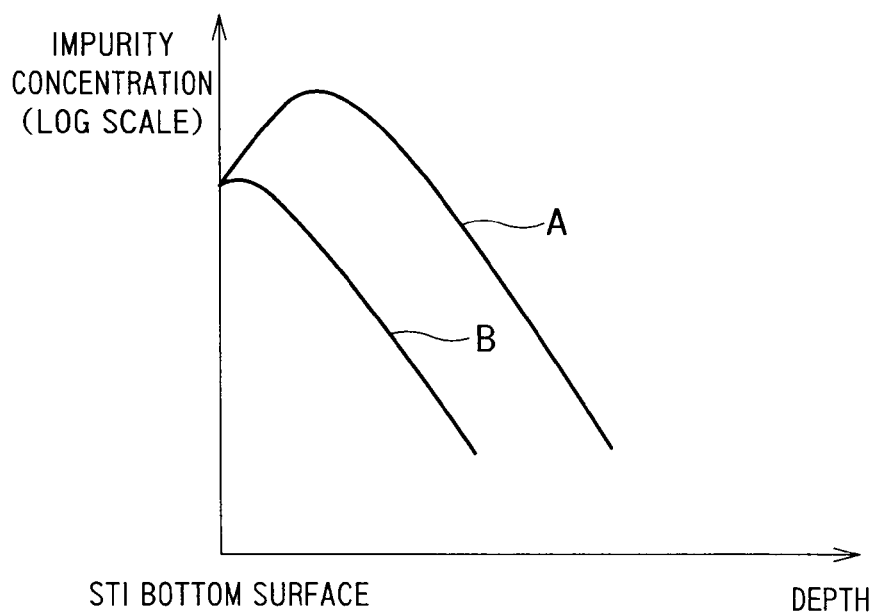
FIG. 6 is a graph showing the impurity concentration of the first and second impurity diffusion layers 5 and 2 for comparison.

FIG. 6 is a graph showing the impurity concentration of the first and second impurity diffusion layers 5 and 2 for comparison.

In FIG. 6, the line A indicates the distribution of the impurity concentration of the second impurity diffusion layer 2 at the point X1 on the line Y-Y' in FIG. 2. The line B indicates the distribution of the impurity concentration of the first impurity diffusion layer 5 at the point X2 on the line Z-Z' in FIG. 2. In FIG. 6, the abscissa indicates the depth from the bottom surface of the first and second device isolation insulating films 4a and 4b in the direction of the lower surface of the semiconductor substrate 7, and the ordinate indicates the impurity concentration on the log scale.

As shown in FIG. 6, the first and second impurity diffusion layers 5 and 2 (indicated by the lines A and B) have substantially equal impurity concentrations at depths close to the bottom surface of the first and second device isolation insulating films 4a and 4b.

However, as the depth becomes greater, the impurity concentration of the second impurity diffusion layer (indicated by the line A) increases.

On the other hand, the impurity concentration of the first impurity diffusion layer 5 (indicated by the line B) has a peak at a depth close to the bottom surface of the first device isolation insulating film 4a and decreases as the depth becomes greater.

Since the semiconductor device 100 is configured as described above, the following advantages (1) to (3) are achieved.

(1) A first advantage is that the impurity concentration of the first impurity diffusion layer (field inversion preventing layer) 5 below the gate electrode 1 and the impurity concentration of the second impurity diffusion layer (field inversion preventing layer) 2 between the device regions whose gate electrodes 1 are not connected to each other can be optimized. As a result, the punch through breakdown voltage can be improved while preventing the voltage drop transferred by the high-voltage insulated-gate field effect transistors.

For example, a high electrical field having a voltage of about 10 to 30 V is applied to the gate electrode of the high-voltage insulated-gate field effect transistor "TR1", which is a transfer gate transistor. Therefore, a depletion layer is formed in the well region between the first device isolation insulating films 4a below the gate electrode 1. In this state, if the impurity concentration of the first impurity diffusion layer 5 is excessively high, the threshold voltage rises, and thus, the problem of the voltage of the word lines "WL1" to "WL8" is reduced in other to voltage drop transferred by the high-voltage insulated-gate field effect transistors.

Furthermore, there is a problem concerning the potential difference between the device regions adjacent to each other in the gate length direction (the longitudinal direction in FIG. 2).

For example, a potential difference of about 20 V can occur between the device regions adjacent to each other in the gate length direction (the longitudinal direction in FIG. 2). As an example, there will be described a case where data is written to a memory cell transistor connected to the first high-voltage insulated-gate field effect transistor "TR1".

In this case, for example, a voltage of 24 V is applied to the gate electrodes of the first and second high-voltage insulated-gate field effect transistors "TR1" and "TR2", a program voltage (23 V, for example) is applied to the drain of the first high-voltage insulated-gate field effect transistor "TR1", and a pass voltage (13 V, for example) is applied to the drain of the second high-voltage insulated-gate field effect transistor "TR2". Then, charges are injected to the floating gate electrode of the memory cell transistor connected to the first high-voltage insulated-gate field effect transistor "TR1", and data is written to the memory cell transistor. In this process, a first potential difference "V1" between the drains is 10 V.

In this case, as described earlier, the third high-voltage insulated-gate field effect transistor "TR3" is connected to a memory cell transistor in another block. That is, the third high-voltage insulated-gate field effect transistor is not involved in data write of the relevant memory cell transistor, and therefore, a voltage of 0 V is applied to the drain of the third high-voltage insulated-gate field effect transistor "TR3", for example. That is, a second potential difference "V2" between the drains of the first and third high-voltage insulated-gate field effect transistors "TR1" and "TR3" is 23 V.

As described above, in some cases, the second potential difference "V2" between the drain of the first high-voltage insulated-gate field effect transistor "TR1" and the drain of the third high-voltage insulated-gate field effect transistor "TR3" is greater than the first potential difference "V1" between the drain of the first high-voltage insulated-gate field effect transistor "TR1" and the drain of the second high-voltage insulated-gate field effect transistor "TR2".

In such a case, if the impurity concentration of the second impurity diffusion layer 2 is insufficient (approximately equal to the impurity concentration of the first impurity diffusion layer 5, for example), a required punch through breakdown voltage cannot be achieved. Therefore, a big current flows between the device regions adjacent to each other with the second device isolation insulating film 4b interposed therebetween.

To avoid this, for example, as in this embodiment, the concentration distribution of the first field inversion preventing layer and the second field inversion preventing layer are formed to have concentration distributions shown in FIG. 6. That is, the second impurity diffusion layer 2 is formed to have a higher impurity concentration than the first impurity diffusion layer 5. In addition, the first impurity diffusion layer 5 and the second impurity diffusion layer 2 are formed so that the depth of the second impurity diffusion layer 2 in the semiconductor substrate 7 at the peak of the impurity concentration thereof is greater than the depth of the first impurity diffusion layer 5 in the semiconductor substrate 7 at the peak of the impurity concentration thereof.

As a result, as described above, a required punch through breakdown voltage can be achieved while preventing the voltage drop transferred by the high-voltage insulated-gate field effect transistors.

(2) A second advantage is that the reliability of the transfer gate transistors (the high-voltage insulated-gate field effect transistors) can be improved since the $p^+$ diffusion layer 8 formed between the device regions adjacent to each other in the longitudinal direction is used as a dummy device region. For example, noise can be removed by applying the voltage of the $p^+$ diffusion layer 8 at 0 V.

(3) A third advantage is that miniaturization can be advantageously achieved. According to the prior art, the concentration distribution of the impurity diffusion layer (field inversion preventing layer) between the device regions adjacent to each other in the gate width direction (the lateral direction in FIG. 2) is the same as the concentration distribution of the impurity diffusion layer (field inversion preventing layer) between the device regions adjacent to each other in the gate length direction (the longitudinal direction in FIG. 2).

However, as described above, since the impurity diffusion layers have the impurity concentrations as shown in FIG. 6, a junction breakdown can be prevented with higher reliability while preventing the voltage drop transferred by the high-voltage insulated-gate field effect transistors.

Therefore, compared with the prior art, the margin for the breakdown voltage increases, so that the interval between the device regions in the lateral direction can be reduced. That is, the semiconductor device can be further miniaturized.

Next, there will be described an exemplary method of manufacturing the semiconductor device 100 having the configuration and functions described above.

For the sake of simplicity, the following description will be particularly focused on the structures of the two high-voltage insulated-gate field effect transistors "TR1" and "TR3".

Figure 7A:
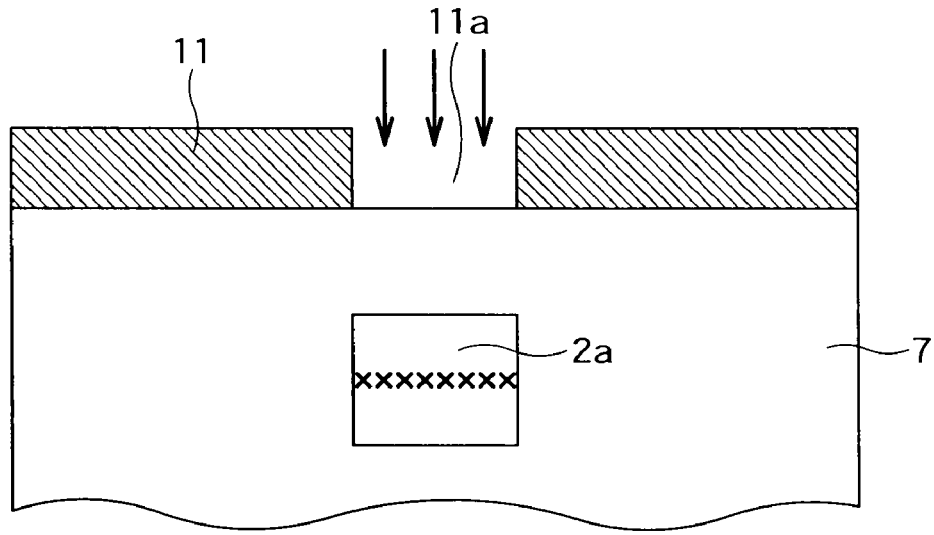
FIG. 7A is a schematic cross-sectional view for illustrating a method of manufacturing the semiconductor device according to the embodiment 1 of the present invention, taken along the line Y-Y' in FIG. 2.
Figure 7B:
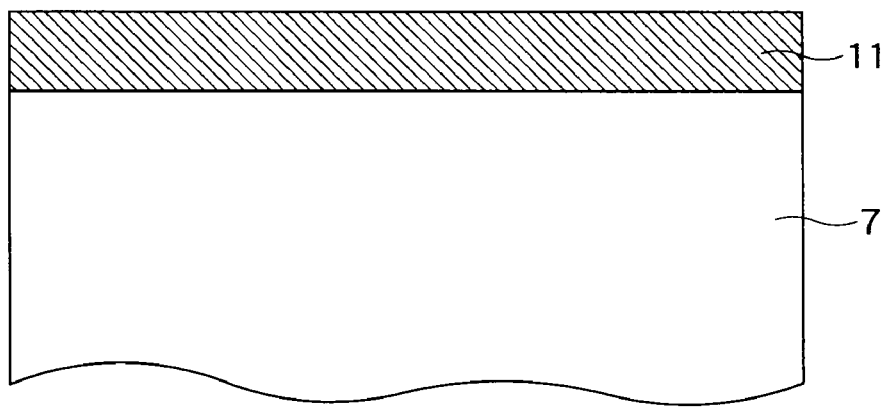
FIG. 7B is a schematic cross-sectional view for illustrating the method of manufacturing the semiconductor device according to the embodiment 1 of the present invention taken along the line Z-Z' in FIG. 2.
Figure 8A:
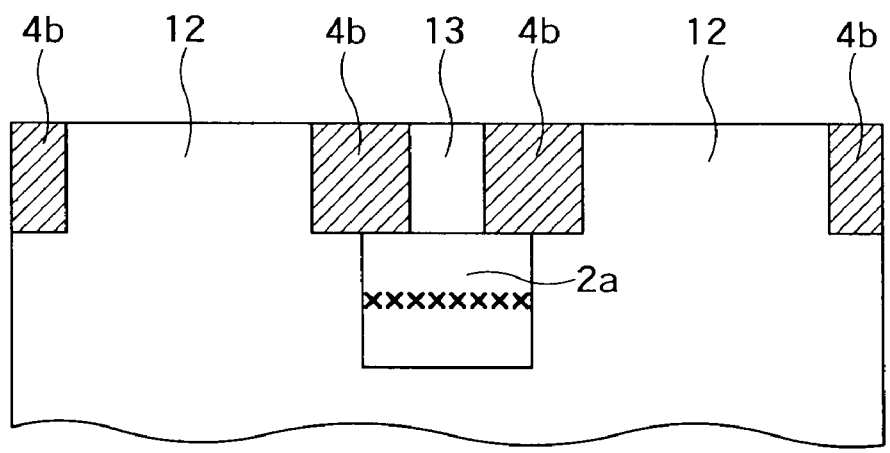
FIG. 8A is a schematic cross-sectional view for illustrating a method of manufacturing the semiconductor device according to the embodiment 1 of the present invention, taken along the line Y-Y' in FIG. 2, and follows from FIG. 7A.
Figure 8B:
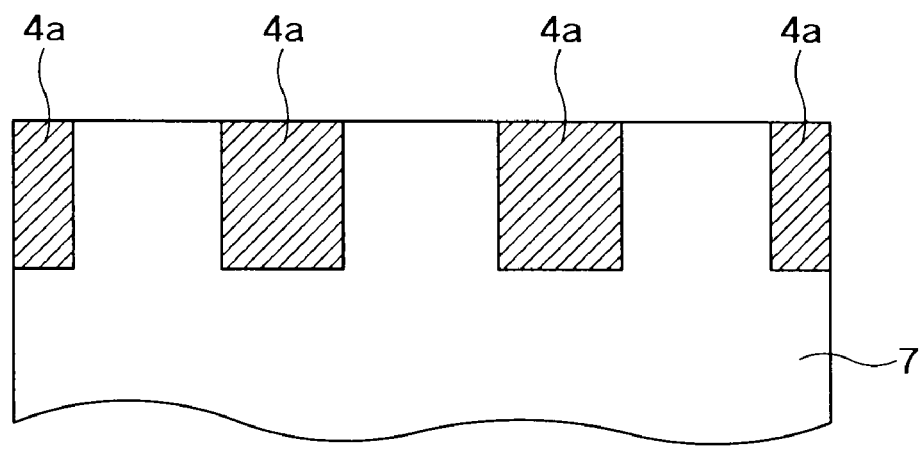
FIG. 8B is a schematic cross-sectional view for illustrating the method of manufacturing the semiconductor device according to the embodiment 1 of the present invention taken along the line Z-Z' in FIG. 2, and follows from FIG. 7B.
Figure 9A:
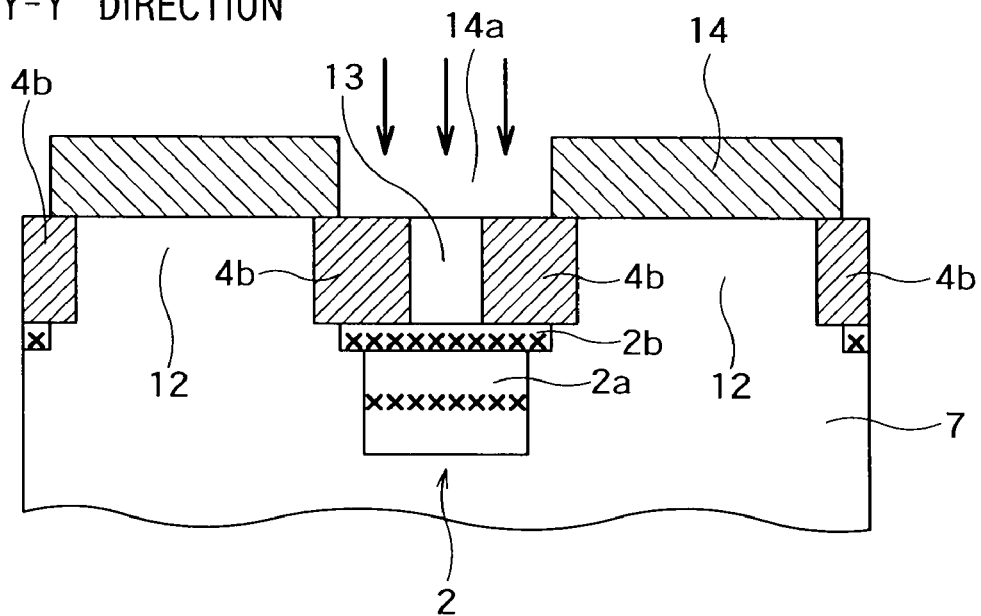
FIG. 9A is a schematic cross-sectional view for illustrating a method of manufacturing the semiconductor device according to the embodiment 1 of the present invention, taken along the line Y-Y' in FIG. 2, and follows from FIG. 8A.
Figure 9B:
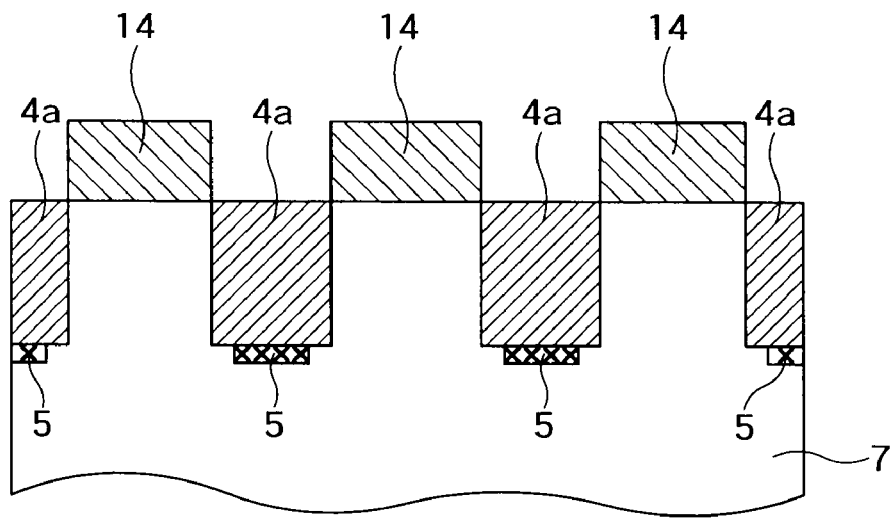
FIG. 9B is a schematic cross-sectional view for illustrating the method of manufacturing the semiconductor device according to the embodiment 1 of the present invention taken along the line Z-Z' in FIG. 2, and follows from FIG. 8B.

FIGS. 7A, 8A and 9A are schematic cross-sectional views for illustrating a method of manufacturing the semiconductor device according to the embodiment 1 of the present invention, which is an aspect of the present invention, taken along the line Y-Y' in FIG. 2. FIGS. 7B, 8B and 9B are schematic cross-sectional views for illustrating the method of manufacturing the semiconductor device according to the embodiment 1 of the present invention, which is an aspect of the present invention, taken along the line Z-Z' in FIG. 2.

First, as shown in FIGS. 7A and 7B, a first resist layer 11 having a first opening 11a is formed on the semiconductor substrate 7. Using the first resist layer 11 as a mask, the impurity diffusion layer 2a of the second impurity diffusion layer 2 is formed.

The impurity diffusion layer 2a may also be formed simultaneously with a p-type well region of an LV transistor (not shown) or a memory cell transistor (not shown).

The impurity diffusion layer 2a is formed by ion implantation of boron ion (B) as a p-type impurity under the conditions that the acceleration is 200 keV to 300 keV and the concentration is about $1\times10^{12}/cm^2$ to $5\times10^{13}/cm^2$, for example. Reference character "X" in FIG. 7 represents the level of the peak of the p-type impurity concentration of the impurity diffusion layer 2a.

Then, a layout of the device regions 12 and 13 is formed by patterning using lithography, for example, and a trench is formed in the semiconductor substrate 7 by etching, such as RIE.

Then, an insulating layer, such as a silicon oxide film and a partially stabilized zirconia (PSZ) film, is buried in the trench. Then, the surface of the insulating layer is planarized by chemical mechanical polishing (CMP) or the like.

In this way, as shown in FIG. 8A, the second device isolation insulating films 4b having the bottom surface at a level shallower than the level of the peak concentration of the impurity diffusion layer 2a is formed. In addition, as shown in FIG. 8B, the first device isolation insulating films 4a are formed at the same time. That is, a plurality of device regions 12 and 13 surrounded by the first and second device isolation insulating films 4a and 4b are formed.

The device region 13 as a dummy is formed between the second device isolation insulating films 4b. Therefore, the width of the second device isolation insulating films 4b can be reduced. That is, dishing in CMP in the step of forming the second device isolation insulating films 4b is advantageously reduced, so that the planarity of the principal surface of the semiconductor substrate 7 is improved.

Then, as shown in FIG. 9A, a second resist layer 14 having a second opening 14a is newly formed on the semiconductor substrate 7 by lithography. Then, using the second resist layer 14 as a mask, the impurity diffusion layer 2b is formed below the device isolation insulating films 4 in the semiconductor substrate 7. At the same time, as shown in FIG. 9B, a second resist layer 14 having a second opening 14a is newly formed on the semiconductor substrate 7 by lithography, and using the second resist layer 14 as a mask, the first impurity diffusion layer 5 and the impurity diffusion layer 2b is formed at the same time.

The impurity diffusion layer 2b is formed by ion implantation of boron ion (B) as a p-type impurity under the conditions that the acceleration is 100 keV to 200 keV and the concentration is about $1\times10^{11}/cm^2$ to $1\times10^{13}/cm^2$, for example. The concentration distribution of the impurity diffusion layer 2a is as shown by the line A in FIG. 6, and the concentration distribution of the impurity diffusion layer 2b is as shown by the line B in FIG. 6. The impurity diffusion layer 2b included in the second impurity diffusion layer 2 allows the impurity concentration of the second impurity diffusion layer 2 to be increased with higher reliability. However, as described earlier, the impurity diffusion layer 2b may be omitted as required.

Since the first impurity diffusion layer 5 and the impurity diffusion layer 2b is formed at the same time, the first impurity diffusion layer 5 has the same impurity profile as the impurity diffusion layer 2b. That is, the second impurity diffusion layer 2 can have a higher impurity concentration than the first impurity diffusion layer 5. Furthermore, the depth at which the peak of the impurity concentration of the second impurity diffusion layer 2 occurs in the semiconductor substrate 7 can be greater than the depth at which the peak of the impurity concentration of the first impurity diffusion layer 5 occurs in the semiconductor substrate 7.

The second impurity diffusion layer 2 of the semiconductor device 100 is formed by the manufacturing process described above.

The semiconductor device 100 having the configuration and functions described above is improved in breakdown voltage for device isolation between adjacent high-voltage MOSFETs. As a result, a high integration density layout design is possible, and the circuit area can be reduced.

As described above, the impurity diffusion layer 2a may have the same concentration distribution as the P well region formed in another semiconductor device in the same wafer. That is, the impurity diffusion layer 2a may be formed simultaneously with the P well region in the other semiconductor device. Therefore, there is no need to increase the number of steps of the manufacturing method, and the manufacturing cost can be reduced.

As described above, the semiconductor device according to this embodiment can have a smaller size.

Embodiment 2

In the embodiment 1 described above, the semiconductor device includes the impurity diffusion layer 2b, the $p^+$ diffusion layer 8 and the device region 13.

However, from the viewpoint of miniaturization of the semiconductor device, the impurity diffusion layer 2b, the $p^+$ diffusion layer 8 and the device region 13 may be omitted.

Thus, in the following, there will be described a semiconductor device 200 according to an embodiment 2 that does not include the impurity diffusion layer 2b, the $p^+$ diffusion layer 8 and the device region 13. As with the semiconductor device 100 according to the embodiment 1, the semiconductor device 200 is also applied to the NAND flash memory 1000.

Figure 10:
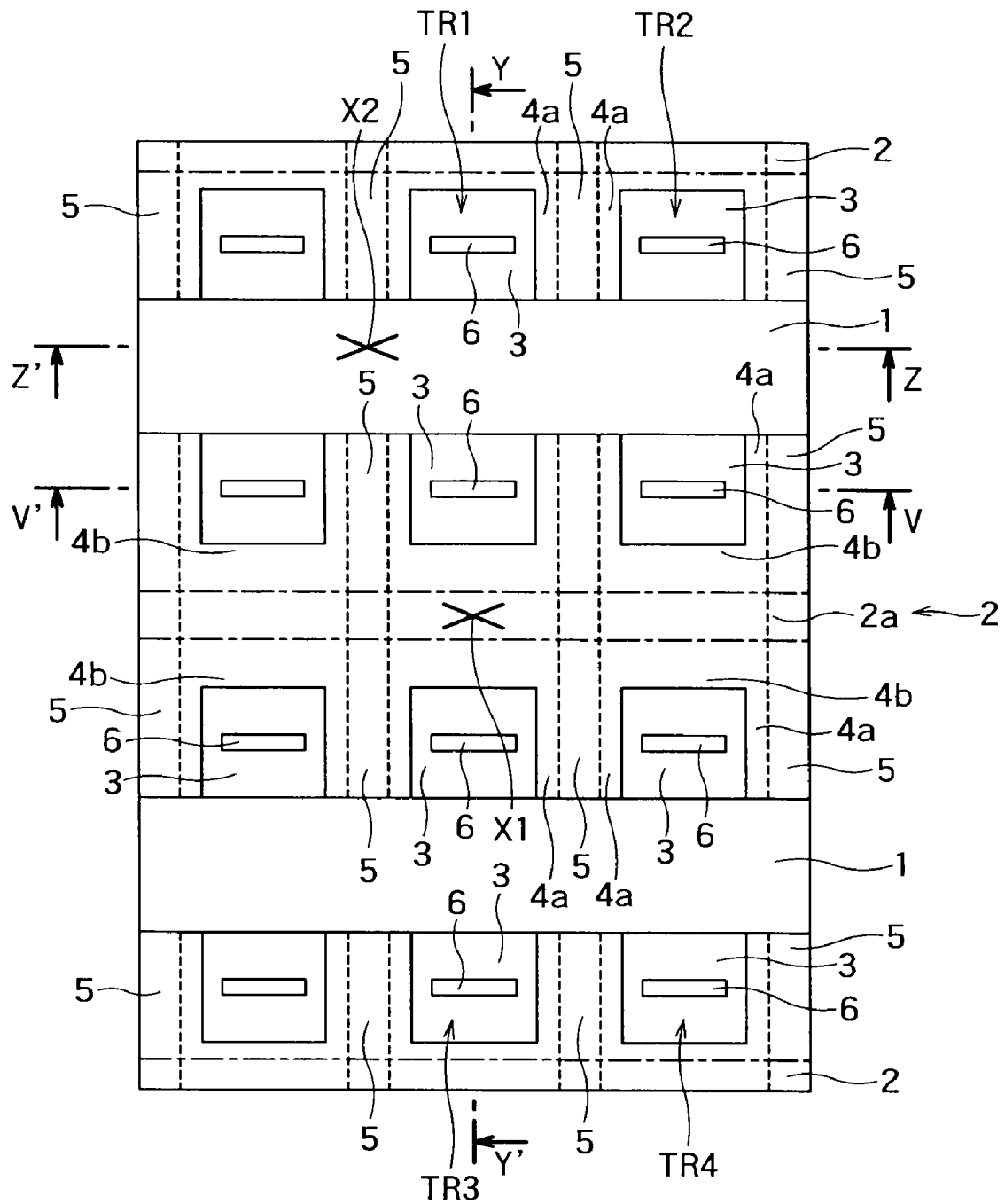
FIG. 10 is a schematic plan view showing an exemplary configuration of the semiconductor device 200 including high-voltage insulated-gate field effect transistors.
Figure 11:
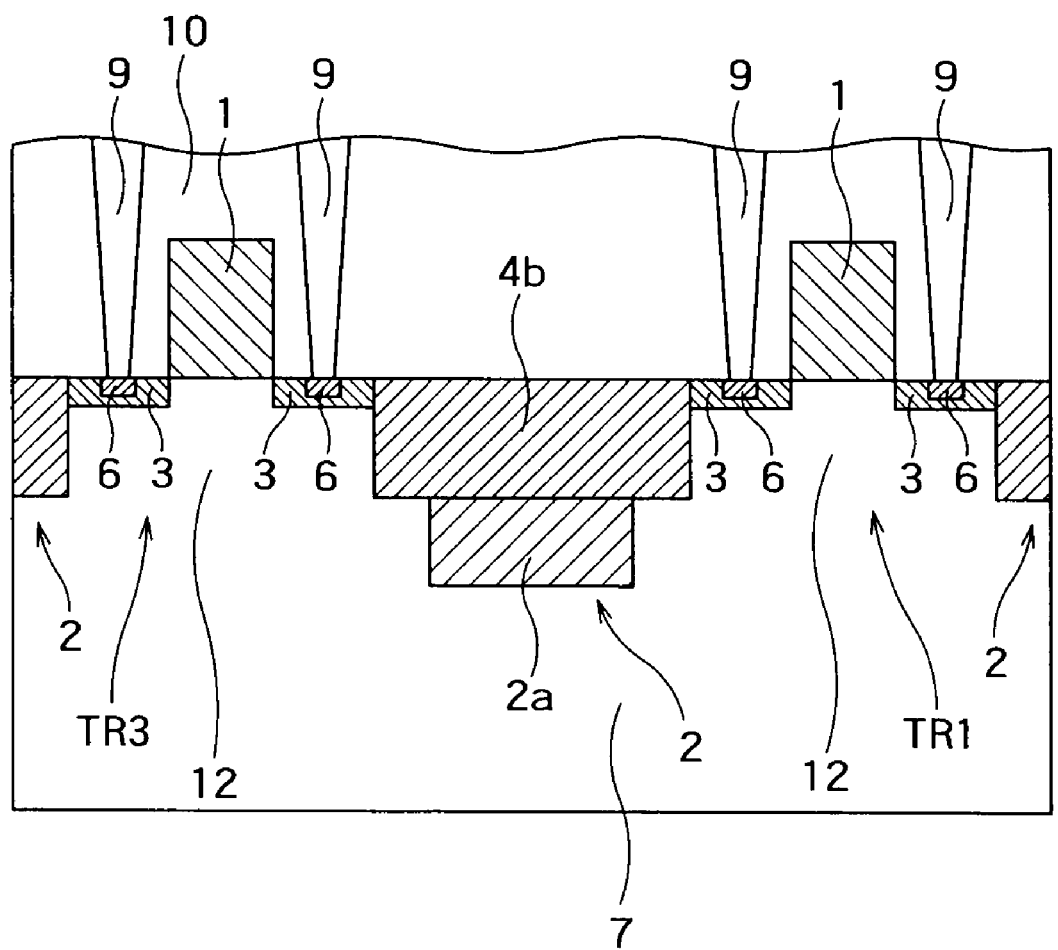
FIG. 11 is a cross-sectional view of the semiconductor device 200 taken along the line Y-Y' in FIG. 10.

FIG. 10 is a schematic plan view showing an exemplary configuration of the semiconductor device 200 including high-voltage insulated-gate field effect transistors. For the sake of simplicity, illustration of some components including a contact electrode 9 and an interlayer insulating film 10 is omitted in FIG. 10. FIG. 11 is a cross-sectional view of the semiconductor device 200 taken along the line Y-Y' in FIG. 10.

The cross sectional view of the semiconductor device 200 taken along the line Z-Z' in FIG. 10 is the same as FIG. 4 showing the embodiment 1. The cross sectional view of the semiconductor device 200 taken along the line V-V' in FIG. 10 is the same as FIG. 5 showing the embodiment 1.

The components in FIGS. 10 and 11 denoted by the same reference numerals as the components in FIGS. 2 and 3 showing the embodiment 1 are the same as those components in FIGS. 2 and 3 (except for a second impurity diffusion layer 2 and a second device isolation insulating film 4b).

As shown in FIGS. 10 and 11, as in the embodiment 1, the semiconductor device 200 has a semiconductor substrate 7, a first high-voltage insulated-gate field effect transistor "TR1", a second high-voltage insulated-gate field effect transistor "TR2", a third high-voltage insulated-gate field effect transistor "TR3" and a fourth high-voltage insulated-gate field effect transistor "TR4".

Furthermore, the semiconductor device 200 has a first device isolation insulating film 4a, a second device isolation insulating film 4b, a first impurity diffusion layer 5 of a first conductivity type (the p type in this example), and a second impurity diffusion layer 2 of the first conductivity type (the p type in this example).

The first and second device isolation insulating films 4a and 4b divide the semiconductor substrate 7 into a plurality of device regions 12, 13. Unlike the embodiment 1, the impurity diffusion layer 2b and the $p^+$ diffusion layer 8 are not formed between the first high-voltage insulated-gate field effect transistor "TR1" and the third high-voltage insulated-gate field effect transistor "TR3".

Furthermore, as shown in FIG. 11, the second impurity diffusion layer 2 is formed below the second device isolation insulating film 4b formed between the first and third high-voltage insulated-gate field effect transistors "TR1" and "TR3". The second impurity diffusion layer 2 includes an impurity diffusion layer 2a. Unlike the embodiment 1, there are not the $p^+$ diffusion layer 8 and the device region 13, which are formed between separate second device isolation insulating films 4b in the embodiment 1. That is, the first high-voltage insulated-gate field effect transistor "TR1" and the third high-voltage insulated-gate field effect transistor "TR3" are formed on the opposite sides of the second device isolation insulating film 4b.

The impurity diffusion layer 2a is formed below the second device isolation insulating film 4b. The impurity diffusion layer 2a functions at least as a field inversion preventing layer.

The impurity diffusion layer 2a has a higher impurity concentration than the first impurity diffusion layer 5. Furthermore, the depth of the impurity diffusion layer 2a in the semiconductor substrate 7 at the peak of the impurity concentration thereof is greater than the depth of the first impurity diffusion layer 5 in the semiconductor substrate 7 at the peak of the impurity concentration thereof.

For example, the impurity diffusion layer 2a has an impurity concentration (boron ion(B)) of about $1\times10^{17}/cm^3$ to $1\times10^{18}/cm^3$.

That is, also in the embodiment 2, the second impurity diffusion layer 2 has a smaller width and a higher impurity concentration than the first impurity diffusion layer 5. Furthermore, the depth of the second impurity diffusion layer 2 in the semiconductor substrate 7 at the peak of the impurity concentration thereof is greater than the depth of the first impurity diffusion layer 5 in the semiconductor substrate 7 at the peak of the impurity concentration thereof.

Thus, as in the embodiment 1, a required punch through breakdown voltage can be achieved while preventing the voltage transferred by the high-voltage insulated-gate field effect transistors from being reduced.

Furthermore, in the embodiment 2, as in the embodiment 1, a junction breakdown can be prevented with higher reliability while preventing the voltage drop transferred by the high-voltage insulated-gate field effect transistors. Therefore, compared with the prior art, the margin for the breakdown voltage increases, so that the interval between the device regions in the lateral direction can be reduced. That is, the semiconductor device can be further miniaturized.

Furthermore, since the $p^+$ diffusion layer 8 and the device region 13 are not formed between the first high-voltage insulated-gate field effect transistor "TR1" and the third high-voltage insulated-gate field effect transistor "TR3", the interval between the device regions in the longitudinal direction can be reduced.

Next, there will be described an exemplary method of manufacturing the semiconductor device 200 having the configuration and functions described above.

For the sake of simplicity, the following description will be particularly focused on the structures of the two high-voltage insulated-gate field effect transistors "TR1" and "TR3".

Figure 12A:
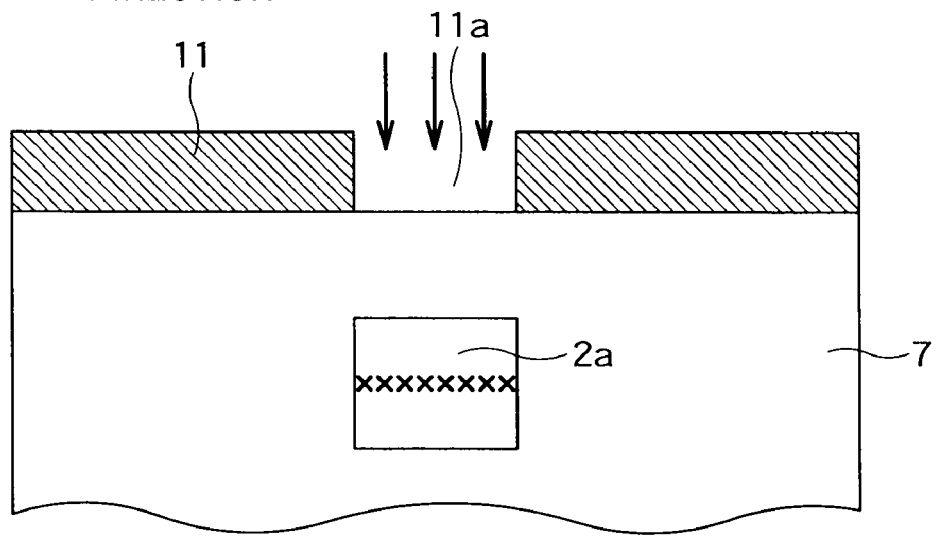
FIG. 12A is a schematic cross-sectional view for illustrating a method of manufacturing the semiconductor device according to the embodiment 2 of the present invention, taken along the line Y-Y' in FIG. 10.
Figure 12B:
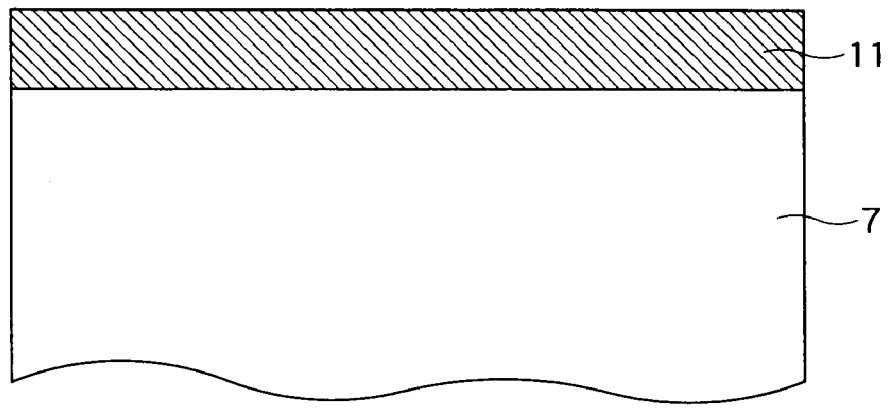
FIG. 12B is a schematic cross-sectional view for illustrating the method of manufacturing the semiconductor device according to the embodiment 2 of the present invention, taken along the line Z-Z' in FIG. 10.
Figure 13A:
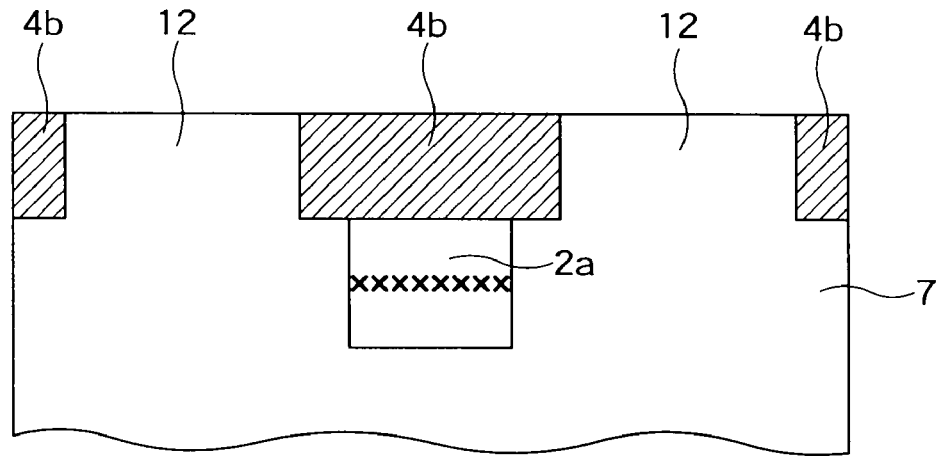
FIG. 13A is a schematic cross-sectional view for illustrating a method of manufacturing the semiconductor device according to the embodiment 2 of the present invention, taken along the line Y-Y' in FIG. 10, and follows from FIG. 12A.
Figure 13B:
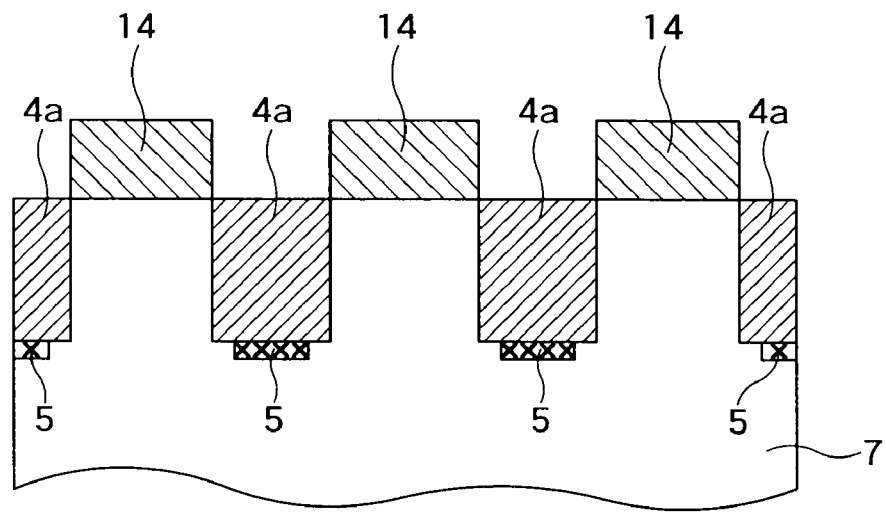
FIG. 13B is a schematic cross-sectional view for illustrating the method of manufacturing the semiconductor device according to the embodiment 2 of the present invention, taken along the line Z-Z' in FIG. 10, and follows from FIG. 12B.

FIGS. 12A and 13A are schematic cross-sectional views for illustrating a method of manufacturing the semiconductor device according to the embodiment 2 of the present invention, which is an aspect of the present invention, taken along the line Y-Y' in FIG. 10. FIGS. 12B and 13B are schematic cross-sectional views for illustrating the method of manufacturing the semiconductor device according to the embodiment 2 of the present invention, which is an aspect of the present invention, taken along the line Z-Z' in FIG. 10.

First, as shown in FIGS. 12A and 12B, a first resist layer 11 having a first opening 11a is formed on the semiconductor substrate 7. Using the first resist layer 11 as a mask, the impurity diffusion layer 2a of the second impurity diffusion layer 2 is formed.

The impurity diffusion layer 2a can also be formed simultaneously with a p-type well region of an LV transistor (not shown) or a memory cell transistor (not shown).

The impurity diffusion layer 2a is formed by ion implantation of boron ion (B) as a p-type impurity under the conditions that the acceleration is 200 keV to 300 keV and the concentration is about $1\times10^{12}/cm^2$ to $5\times10^{13}/cm^2$, for example. Reference character "X" in FIG. 12A represents the level of the peak of the p-type impurity concentration of the impurity diffusion layer 2a.

Then, a layout of the device regions 12 is formed by patterning using lithography, for example, and a trench is formed in the semiconductor substrate 7 by etching, such as RIE.

Then, an insulating layer, such as a silicon oxide film and a partially stabilized zirconia (PSZ) film, is buried in the trench. Then, the surface of the insulating layer is planarized by chemical mechanical polishing (CMP) or the like.

In this way, as shown in FIG. 13A, the second device isolation insulating films 4b having the bottom surface at a level shallower than the level of the peak concentration of the impurity diffusion layer 2a are formed. In addition, as shown in FIG. 13B, the first device isolation insulating films 4a are similarly formed. That is, a plurality of device regions 12 surrounded by the first and second device isolation insulating films 4a and 4b are formed.

The concentration distribution of the impurity diffusion layer 2a is as shown by the line A in FIG. 6 showing the embodiment 1.

The second impurity diffusion layer 2 of the semiconductor device 200 is formed by the manufacturing process described above.

The semiconductor device 200 having the configuration and functions described above is improved in breakdown voltage for device isolation between adjacent high-voltage MOSFETs. As a result, a high integration density layout design is possible, and the circuit area can be reduced.

As described above, the impurity diffusion layer 2a may have the same concentration distribution as the P well region formed in another semiconductor device in the same wafer. That is, the impurity diffusion layer 2a may be formed simultaneously with the P well region in the other semiconductor device. Therefore, there is no need to increase the number of steps of the manufacturing method, and the manufacturing cost can be reduced.

As described above, as in the embodiment 1, the semiconductor device according to this embodiment can have a smaller size.

Embodiment 3

In the embodiment 2, the semiconductor device 200 that does not include the impurity diffusion layer 2b, the $p^+$ diffusion layer 8 and the device region 13 has been described.

However, from the viewpoint of miniaturization of the semiconductor device, the impurity diffusion layer 2b alone may be omitted as required.

Thus, in the following, there will be described a configuration of a semiconductor device 300 according to an embodiment 3 that does not include the impurity diffusion layer 2b. As with the semiconductor device 100 according to the embodiment 1, the semiconductor device 300 is also applied to the NAND flash memory 1000.

Figure 14:
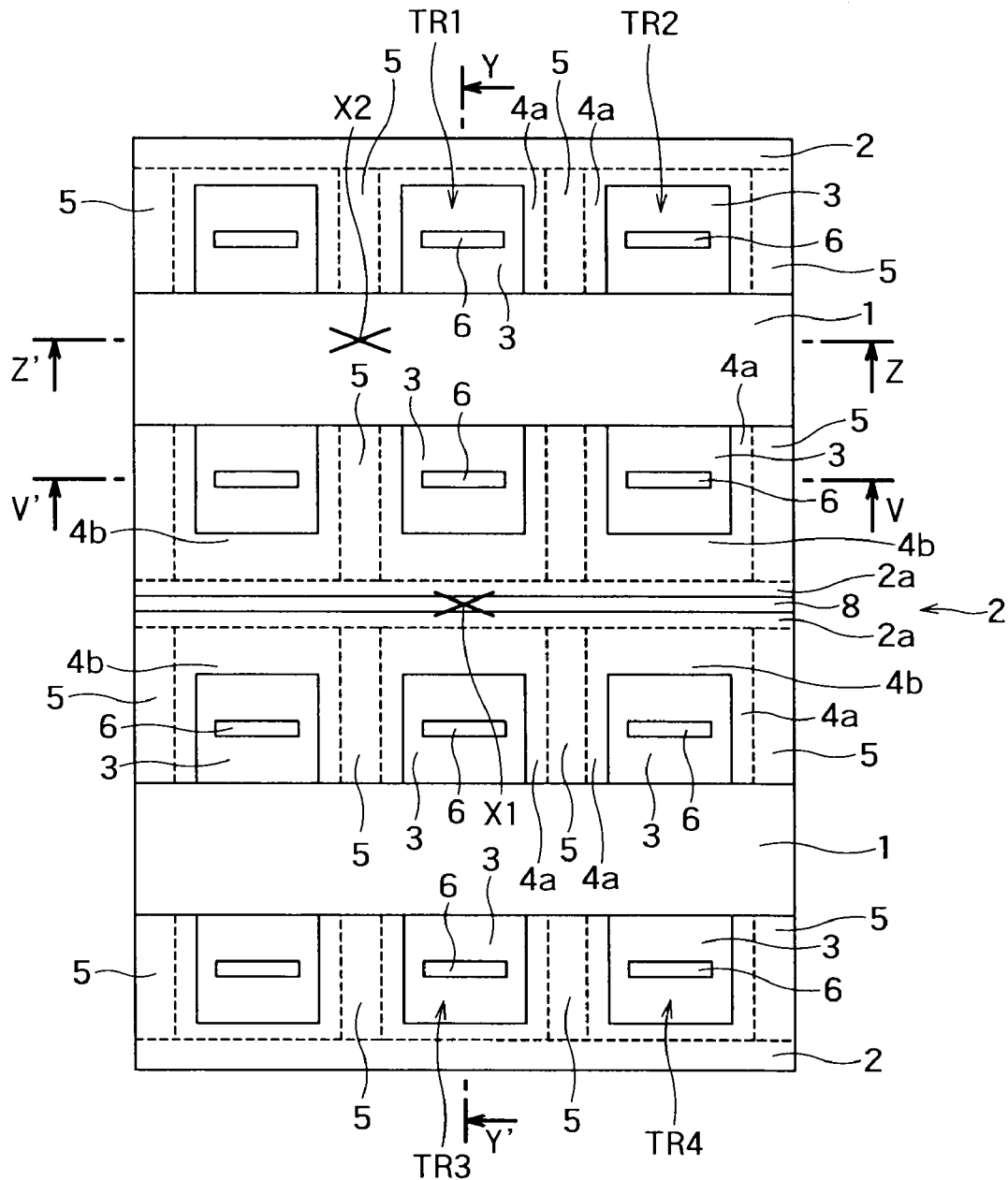
FIG. 14 is a schematic plan view showing an exemplary configuration of the semiconductor device 300 including high-voltage insulated-gate field effect transistors.
Figure 15:
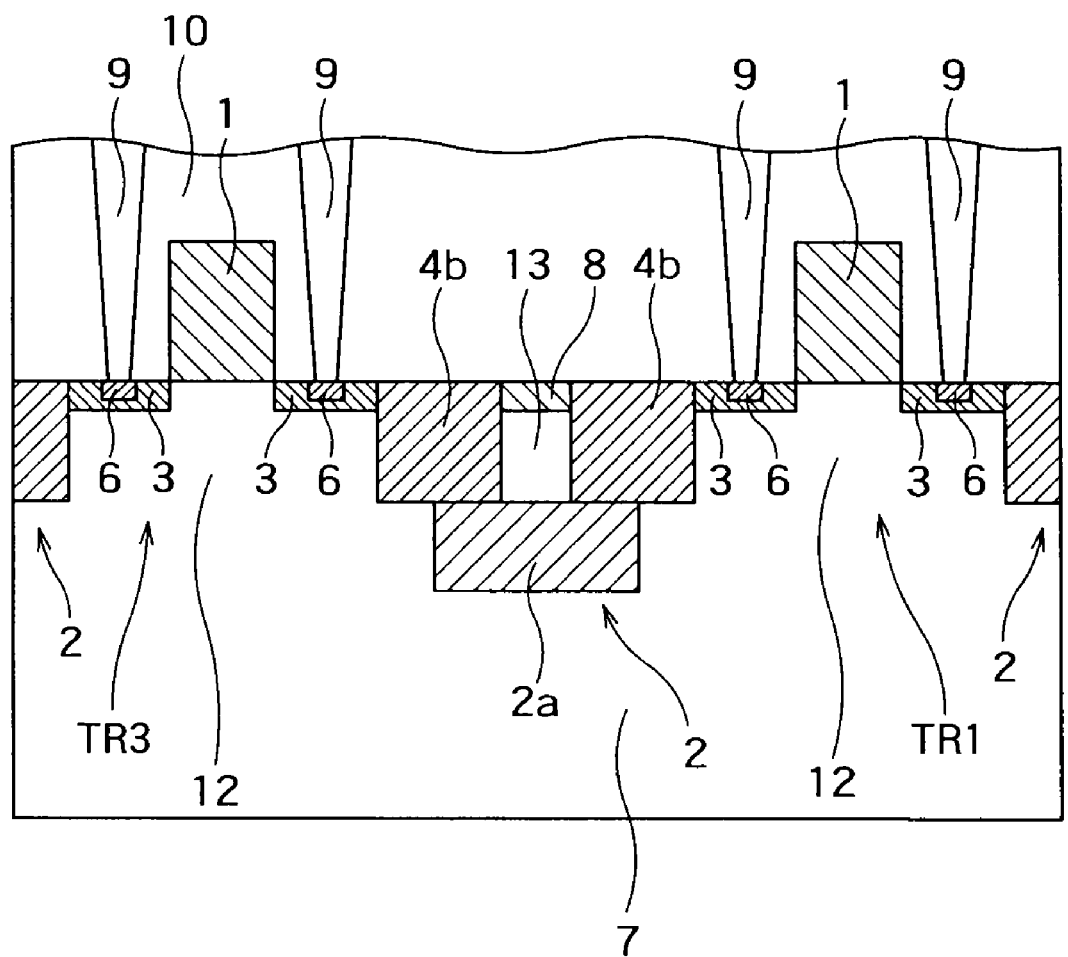
FIG. 15 is a cross-sectional view of the semiconductor device 300 taken along the line Y-Y' in FIG. 14.

FIG. 14 is a schematic plan view showing an exemplary configuration of the semiconductor device 300 including high-voltage insulated-gate field effect transistors. For the sake of simplicity, illustration of some components including a contact electrode 9 and an interlayer insulating film 10 is omitted in FIG. 14. FIG. 15 is a cross-sectional view of the semiconductor device 300 taken along the line Y-Y' in FIG. 14.

The cross sectional view of the semiconductor device 300 taken along the line Z-Z' in FIG. 14 is the same as FIG. 4 showing the embodiment 1. The cross sectional view of the semiconductor device 300 taken along the line V-V' in FIG. 14 is the same as FIG. 5 showing the embodiment 1.

The components in FIGS. 14 and 15 denoted by the same reference numerals as the components in FIGS. 2 and 3 showing the embodiment 1 are the same as those components in FIGS. 2 and 3 (except for a second impurity diffusion layer 2).

As shown in FIGS. 14 and 15, as in the embodiment 1, the semiconductor device 300 has a semiconductor substrate 7, a first high-voltage insulated-gate field effect transistor "TR1", a second high-voltage insulated-gate field effect transistor "TR2", a third high-voltage insulated-gate field effect transistor "TR3" and a fourth high-voltage insulated-gate field effect transistor "TR4".

Furthermore, the semiconductor device 300 has a first device isolation insulating film 4a, a second device isolation insulating film 4b, a first impurity diffusion layer 5 of a first conductivity type (the p type in this example), and a second impurity diffusion layer 2 of the first conductivity type (the p type in this example).

The first and second device isolation insulating films 4a and 4b divide the semiconductor substrate 7 into a plurality of device regions 12, 13. Unlike the embodiment 1, the impurity diffusion layer 2b is not formed between the first high-voltage insulated-gate field effect transistor "TR1" and the third high-voltage insulated-gate field effect transistor "TR3".

Furthermore, as shown in FIG. 15, the second impurity diffusion layer 2 is formed to continuously extend below the two device isolation insulating films 4b formed between the first and third high-voltage insulated-gate field effect transistors "TR1" and "TR3" and the p+ diffusion layer 8 formed between the two device isolation insulating films 4b. The second impurity diffusion layer 2 includes an impurity diffusion layer 2a.

The impurity diffusion layer 2a is formed to continuously extend below the two device isolation insulating films 4b and the p+ diffusion layer 8 formed between the two device isolation insulating films 4b. The impurity diffusion layer 2a functions at least as a field inversion preventing layer.

The impurity diffusion layer 2a has a higher impurity concentration than the first impurity diffusion layer 5. Furthermore, the depth of the impurity diffusion layer 2a in the semiconductor substrate 7 at the peak of the impurity concentration thereof is greater than the depth of the first impurity diffusion layer 5 in the semiconductor substrate 7 at the peak of the impurity concentration thereof.

For example, the impurity diffusion layer 2a has an impurity concentration (boron ion(B)) of about $1\times10^{17}/cm^3$ to $1\times10^{18}/cm^3$.

As described above, in the embodiment 3, as in the embodiment 2, the second impurity diffusion layer 2 has a higher impurity concentration than the first impurity diffusion layer 5. Furthermore, the depth of the second impurity diffusion layer 2 in the semiconductor substrate 7 at the peak of the impurity concentration thereof is greater than the depth of the first impurity diffusion layer 5 in the semiconductor substrate 7 at the peak of the impurity concentration thereof.

Thus, as in the embodiment 2, a required punch through breakdown voltage can be achieved while preventing the voltage drop transferred by the high-voltage insulated-gate field effect transistors.

Furthermore, in the embodiment 3, as in the embodiment 1, a junction breakdown can be prevented with higher reliability while preventing the transferred voltage drop.

Therefore, compared with the prior art, the margin for the breakdown voltage increases, so that the interval between the device regions in the lateral direction can be reduced. That is, the semiconductor device can be further miniaturized.

Furthermore, since the impurity diffusion layer 2 does not includes the second impurity diffusion layer 2b formed simultaneously with the impurity diffusion layer 5, the impurity concentration of the impurity diffusion layer 2 can be controlled independently of the impurity diffusion layer 5. As a result, the characteristics of the high-voltage insulated-gate field effect transistors can be more easily controlled.

Next, there will be described an exemplary method of manufacturing the semiconductor device 300 having the configuration and functions described above.

For the sake of simplicity, the following description will be particularly focused on the structures of the two high-voltage insulated-gate field effect transistors "TR1" and "TR3".

Figure 16A:
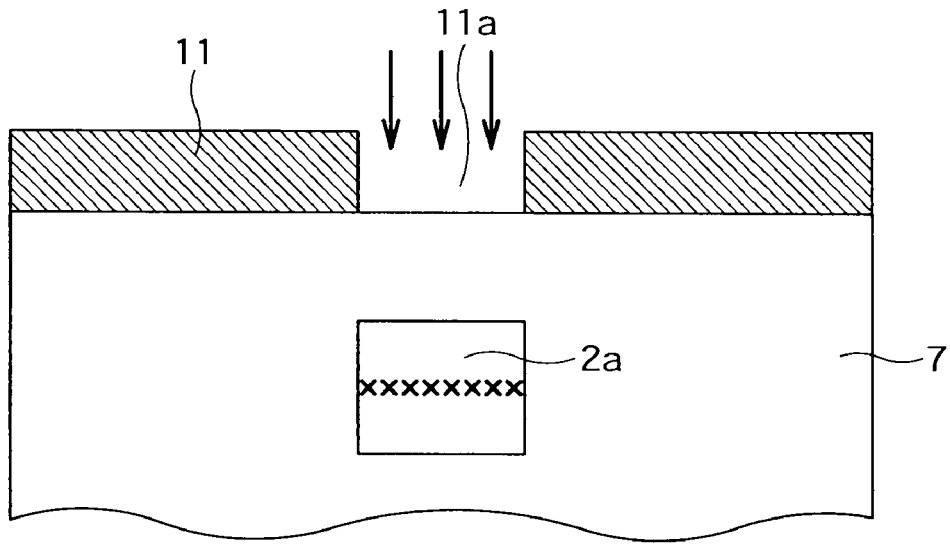
FIG. 16A is a schematic cross-sectional view for illustrating a method of manufacturing the semiconductor device according to the embodiment 3 of the present invention, taken along the line Y-Y' in FIG. 14.
Figure 16B:
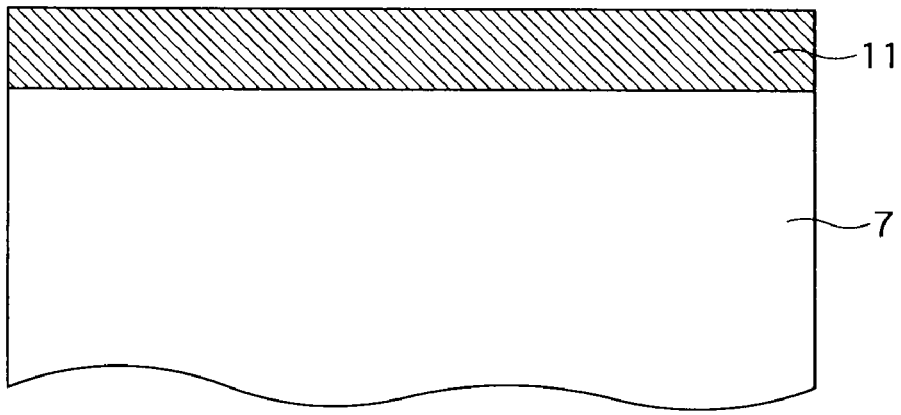
FIG. 16B is a schematic cross-sectional view for illustrating the method of manufacturing the semiconductor device according to the embodiment 3 of the present invention, taken along the line Z-Z' in FIG. 14.
Figure 17A:
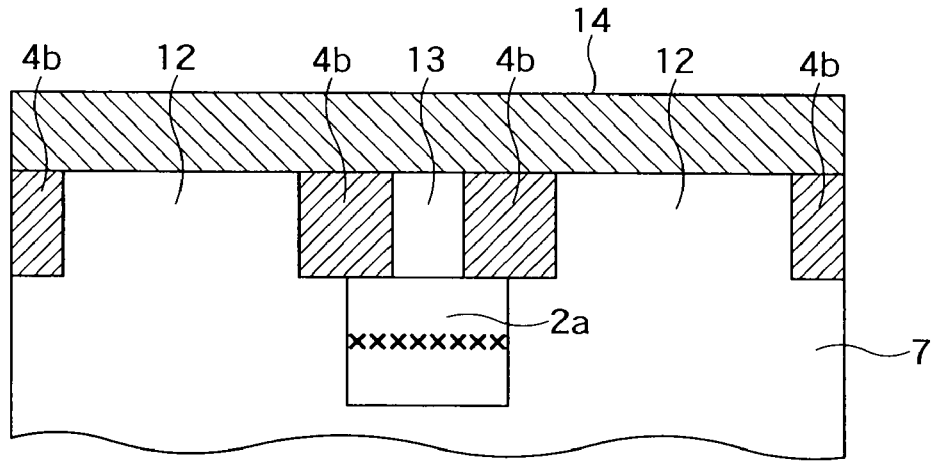
FIG. 17A is a schematic cross-sectional view for illustrating a method of manufacturing the semiconductor device according to the embodiment 3 of the present invention, taken along the line Y-Y' in FIG. 14, and follows from FIG. 16A.
Figure 17B:
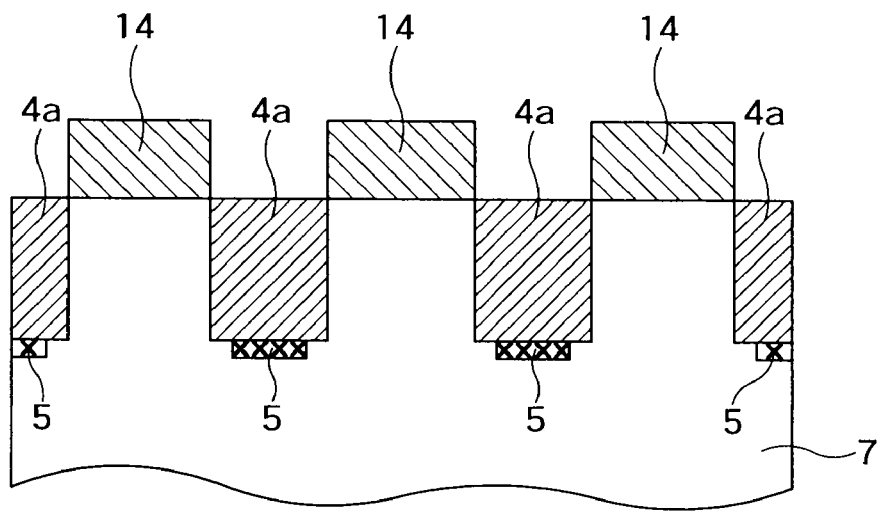
FIG. 17B is a schematic cross-sectional view for illustrating the method of manufacturing the semiconductor device according to the embodiment 3 of the present invention, taken along the line Z-Z' in FIG. 14, and follows from FIG. 16B.

FIGS. 16A and 17A are schematic cross-sectional views for illustrating a method of manufacturing the semiconductor device according to the embodiment 3 of the present invention, which is an aspect of the present invention, taken along the line Y-Y' in FIG. 14. FIGS. 16B and 17B are schematic cross-sectional views for illustrating the method of manufacturing the semiconductor device according to the embodiment 3 of the present invention, which is an aspect of the present invention, taken along the line Z-Z' in FIG. 14.

As shown in FIGS. 16A and 16B, a first resist layer 11 having a first opening 11a is formed on the semiconductor substrate 7. Using the first resist layer 11 as a mask, the impurity diffusion layer 2a of the second impurity diffusion layer 2 is formed.

The impurity diffusion layer 2a may also be formed simultaneously with a p-type well region of an LV transistor (not shown) or a memory cell transistor (not shown).

The impurity diffusion layer 2a is formed by ion implantation of boron ion (B) as a p-type impurity under the conditions that the acceleration is 200 keV to 300 keV and the concentration is about $1\times10^{12}/cm^2$ to $5\times10^{13}/cm^2$, for example. Reference character "X" in FIG. 16A represents the level of the peak of the p-type impurity concentration of the impurity diffusion layer 2a.

Then, a layout of the device regions 12 and 13 is formed by patterning using lithography, for example, and a trench is formed in the semiconductor substrate 7 by etching, such as RIE.

Then, an insulating layer, such as a silicon oxide film and a partially stabilized zirconia (PSZ) film, is buried in the trench. Then, the surface of the insulating layer is planarized by CMP or the like.

In this way, as shown in FIG. 17A, the second device isolation insulating films 4b having the bottom surface at a level shallower than the level of the peak concentration of the impurity diffusion layer 2a are formed. In addition, as shown in FIG. 17B, the first device isolation insulating films 4a are similarly formed. That is, a plurality of device regions 12 and 13 surrounded by the first and second device isolation insulating films 4a and 4b are formed.

As in the embodiment 1, the dummy device region 13 is formed between the second device isolation insulating films 4b. Therefore, the width of the second device isolation insulating films 4b can be reduced. That is, dishing in CMP in the step of forming the second device isolation insulating films 4b is advantageously reduced, so that the planarity of the principal surface of the semiconductor substrate 7 is improved.

The concentration distribution of the impurity diffusion layer 2a is as shown by the line A in FIG. 6 showing the embodiment 1.

The second impurity diffusion layer 2 of the semiconductor device 300 is formed by the manufacturing process described above.

The semiconductor device 300 having the configuration and functions described above is improved in breakdown voltage for device isolation between adjacent high-voltage MOSFETs. As a result, a high integration density layout design is possible, and the circuit area can be reduced.

As described above, the impurity diffusion layer 2a may have the same concentration distribution as the P well region formed in another semiconductor device in the same wafer. That is, the impurity diffusion layer 2a may be formed simultaneously with the P well region in the other semiconductor device. Therefore, there is no need to increase the number of steps of the manufacturing method, and the manufacturing cost can be reduced.

In addition, as in the embodiment 1, since the p+ diffusion layer 8 formed between the device regions adjacent to each other in the longitudinal direction is used as a dummy device region, the reliability of the transfer gate transistors (the high-voltage insulated-gate field effect transistors) can be improved. For example, noise can be removed by setting the voltage of the p+ diffusion layer 8 at 0 V.

As described above, as in the embodiment 1, the semiconductor device according to this embodiment can have a smaller size.

What is claimed is:

1. A semiconductor device, comprising:
a semiconductor substrate of a first conductivity type;
a first high-voltage insulated-gate field effect transistor formed on a principal surface of the semiconductor substrate;
a second high-voltage insulated-gate field effect transistor formed on the principal surface of the semiconductor substrate;
a third high-voltage insulated-gate field effect transistor formed on the principal surface of the semiconductor substrate;
a first device isolation insulating film that is formed in the semiconductor substrate and isolates the first high-voltage insulated-gate field effect transistor and the second high-voltage insulated-gate field effect transistor from each other;
a second device isolation insulating film that is formed in the semiconductor substrate and isolates the first high-voltage insulated-gate field effect transistor and the third high-voltage insulated-gate field effect transistor from each other;
a first impurity diffusion layer of the first conductivity type that is formed below the first device isolation insulating film; and
a second impurity diffusion layer of the first conductivity type that is formed below the second device isolation insulating film,
wherein the gate electrode of the first high-voltage insulated-gate field effect transistor and the gate electrode of the second high-voltage insulated-gate field effect transistor are connected to each other over the first device isolation insulating film, and
the impurity concentration of the second impurity diffusion layer is higher than the impurity concentration of the first impurity diffusion layer.

2. The semiconductor device according to claim 1, wherein a peak of the impurity concentration of the second impurity diffusion layer in the semiconductor substrate is deeper than a peak of the impurity concentration of a peak of the first impurity diffusion layer in the semiconductor substrate.

3. The semiconductor device according to claim 1, wherein the potential difference between the drain of the first high-voltage insulated-gate field effect transistor and the drain of the third high-voltage insulated-gate field effect transistor is greater than the potential difference between the drain of the first high-voltage insulated-gate field effect transistor and the drain of the second high-voltage insulated-gate field effect transistor.

4. The semiconductor device according to claim 1, wherein the first device isolation insulating film and the second device isolation insulating film are orthogonal to each other on the principal surface of the semiconductor substrate.

5. The semiconductor device according to claim 1, wherein the second impurity diffusion layer comprises a third impurity diffusion layer and a fourth impurity diffusion layer which has higher impurity concentration than that of the third impurity diffusion layer.

6. The semiconductor device according to claim 1, wherein the drain of the first high-voltage insulated-gate field effect transistor and the drain of the third high-voltage insulated-gate field effect transistor are adjacent to each other with a plurality of the second device isolation insulating films interposed therebetween, and a device region formed between the second device isolation insulating films.

7. The semiconductor device according to claim 2, wherein the potential difference between the drain of the first high-voltage insulated-gate field effect transistor and the drain of the third high-voltage insulated-gate field effect transistor is greater than the potential difference between the drain of the first high-voltage insulated-gate field effect transistor and the drain of the second high-voltage insulated-gate field effect transistor.

8. The semiconductor device according to claim 2, wherein the drain of the first high-voltage insulated-gate field effect transistor and the drain of the third high-voltage insulated-gate field effect transistor are adjacent to each other with the second device isolation insulating film interposed therebetween.

9. The semiconductor device according to claim 2, wherein the high-voltage insulated-gate field effect transistors are used in a core part of a row decoder of a NAND flash memory.

10. The semiconductor device according to claim 2, wherein the first device isolation insulating film and the second device isolation insulating film are orthogonal to each other on the principal surface of the semiconductor substrate.

11. The semiconductor device according to claim 2, wherein the second impurity diffusion layer comprises a third impurity diffusion layer and a fourth impurity diffusion layer which has higher impurity concentration than that of the third impurity diffusion layer.

12. The semiconductor device according to claim 2, wherein the drain of the first high-voltage insulated-gate field effect transistor and the drain of the third high-voltage insulated-gate field effect transistor are adjacent to each other with a plurality of the second device isolation insulating films interposed therebetween, and a device region formed between the second device isolation insulating films.

13. The semiconductor device according to claim 3, wherein the drain of the first high-voltage insulated-gate field effect transistor and the drain of the third high-voltage insulated-gate field effect transistor are adjacent to each other with the second device isolation insulating film interposed therebetween.

14. The semiconductor device according to claim 5, wherein the third impurity diffusion layer has same impurity concentration as that of the first impurity diffusion layer.

15. The semiconductor device according to claim 11, wherein the third impurity diffusion layer has same impurity concentration as that of the first impurity diffusion layer.

16. The semiconductor device according to claim 6, wherein 0V is applied to the device region.

17. The semiconductor device according to claim 12, wherein 0V is applied to the device region.

* * * * *